(12) United States Patent
Iwakura et al.

(10) Patent No.: US 11,043,615 B2
(45) Date of Patent: *Jun. 22, 2021

(54) LIGHT-EMITTING DEVICE HAVING A DIELECTRIC MULTILAYER FILM ARRANGED ON THE SIDE SURFACE OF THE LIGHT-EMITTING ELEMENT

(71) Applicant: NICHIA CORPORATION, Anan (JP)

(72) Inventors: Daisuke Iwakura, Komatsushima (JP); Yoshiki Inoue, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/010,828

(22) Filed: Sep. 3, 2020

(65) Prior Publication Data

US 2020/0403124 A1    Dec. 24, 2020

Related U.S. Application Data

(62) Division of application No. 16/280,045, filed on Feb. 20, 2019, now Pat. No. 10,797,203.

(30) Foreign Application Priority Data

Feb. 21, 2018    (JP) .............................. JP2018-029186

(51) Int. Cl.
*H01L 33/46*    (2010.01)
*H01L 33/50*    (2010.01)
(Continued)

(52) U.S. Cl.
CPC ............ *H01L 33/46* (2013.01); *C09K 11/617* (2013.01); *C09K 11/646* (2013.01);
(Continued)

(58) Field of Classification Search
CPC ....... H01L 33/46; H01L 33/465; H01L 33/60; H01L 51/50; H01L 51/5265
See application file for complete search history.

(56) References Cited

U.S. PATENT DOCUMENTS 7,622,746 B1    11/2009 Lester et al.
10,797,203 B2 *   10/2020 Iwakura .................. H01L 33/46
(Continued)

FOREIGN PATENT DOCUMENTS

JP    2010-157638    7/2010
JP    2010-219324    9/2010
(Continued)

OTHER PUBLICATIONS

Restriction and Election of Species Requirement issued by the U.S. Patent and Trademark Office for the parent U.S. Appl. No. 16/280,045, dated Feb. 28, 2020.
(Continued)

*Primary Examiner* — Hoai V Pham
(74) *Attorney, Agent, or Firm* — Mori & Ward, LLP

(57) ABSTRACT

A light-emitting device includes a light-emitting element having a top surface, a bottom surface opposite to the top surface, and side surfaces connecting the top surface and the bottom surface. An element electrode of the light-emitting element is located on the bottom surface. A phosphor layer is disposed above the top surface of the light-emitting element and having side surfaces. A reflective member covers side surfaces of the light-emitting element and side surfaces of the phosphor layer. A dielectric multilayer film is disposed on at least one of the side surfaces of the light-emitting element and disposed on at least one of the side surfaces of the phosphor layer and not located between the
(Continued)

light emitting element and the phosphor layer. The dielectric multilayer film is not provided on an upper surface of the phosphor layer.

16 Claims, 14 Drawing Sheets

(51) Int. Cl.
    *H01L 33/60*     (2010.01)
    *C09K 11/77*     (2006.01)
    *C09K 11/64*     (2006.01)
    *C09K 11/61*     (2006.01)
    *H01L 33/56*     (2010.01)
    *H01L 33/54*     (2010.01)

(52) U.S. Cl.
    CPC ........ *C09K 11/7734* (2013.01); *H01L 33/502* (2013.01); *H01L 33/505* (2013.01); *H01L 33/56* (2013.01); *H01L 33/60* (2013.01); *H01L 33/508* (2013.01); *H01L 33/54* (2013.01); *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

| | | |
|---|---|---|
| 2005/0104080 A1 | 5/2005 | Ichihara et al. |
| 2012/0086029 A1 | 4/2012 | Yu et al. |
| 2013/0015483 A1 | 1/2013 | Shimokawa et al. |
| 2015/0340567 A1 | 11/2015 | Ichikawa |
| 2016/0093780 A1 | 3/2016 | Beppu et al. |
| 2016/0093781 A1 | 3/2016 | Tamaki et al. |
| 2016/0181483 A1 | 6/2016 | Eichenberg et al. |
| 2016/0351765 A1 | 12/2016 | Suzuki |
| 2017/0092815 A1 | 3/2017 | Ichikawa |
| 2017/0125654 A1 | 5/2017 | Bando |
| 2017/0229624 A1 | 8/2017 | Beppu et al. |
| 2018/0040583 A1 | 2/2018 | Tamaki et al. |
| 2018/0040775 A1 | 2/2018 | Wakamatsu et al. |
| 2018/0151786 A1 | 5/2018 | Beppu et al. |
| 2018/0190886 A1 | 7/2018 | Suzuki |
| 2019/0165226 A1 | 5/2019 | Kim et al. |

FOREIGN PATENT DOCUMENTS

| | | |
|---|---|---|
| JP | 2012-134355 | 7/2012 |
| JP | 2013-021175 | 1/2013 |
| JP | WO2014/081042 | 5/2014 |
| JP | 2015-195294 | 11/2015 |
| JP | 2015-225862 | 12/2015 |
| JP | 2016-072304 | 5/2016 |
| JP | 2016-072471 | 5/2016 |
| JP | 2016-127052 | 7/2016 |
| JP | 2016-532898 | 10/2016 |
| JP | 2016-219743 | 12/2016 |
| JP | 2017-085085 | 5/2017 |
| JP | 2018-022844 | 2/2018 |
| WO | WO 2005/050748 | 6/2005 |

OTHER PUBLICATIONS

Notice of Allowance with Form PTO-892 Notice of References Cited issued by the United States Patent and Trademark Office for the parent U.S. Appl. No. 16/280,045, dated Jun. 4, 2020.

* cited by examiner

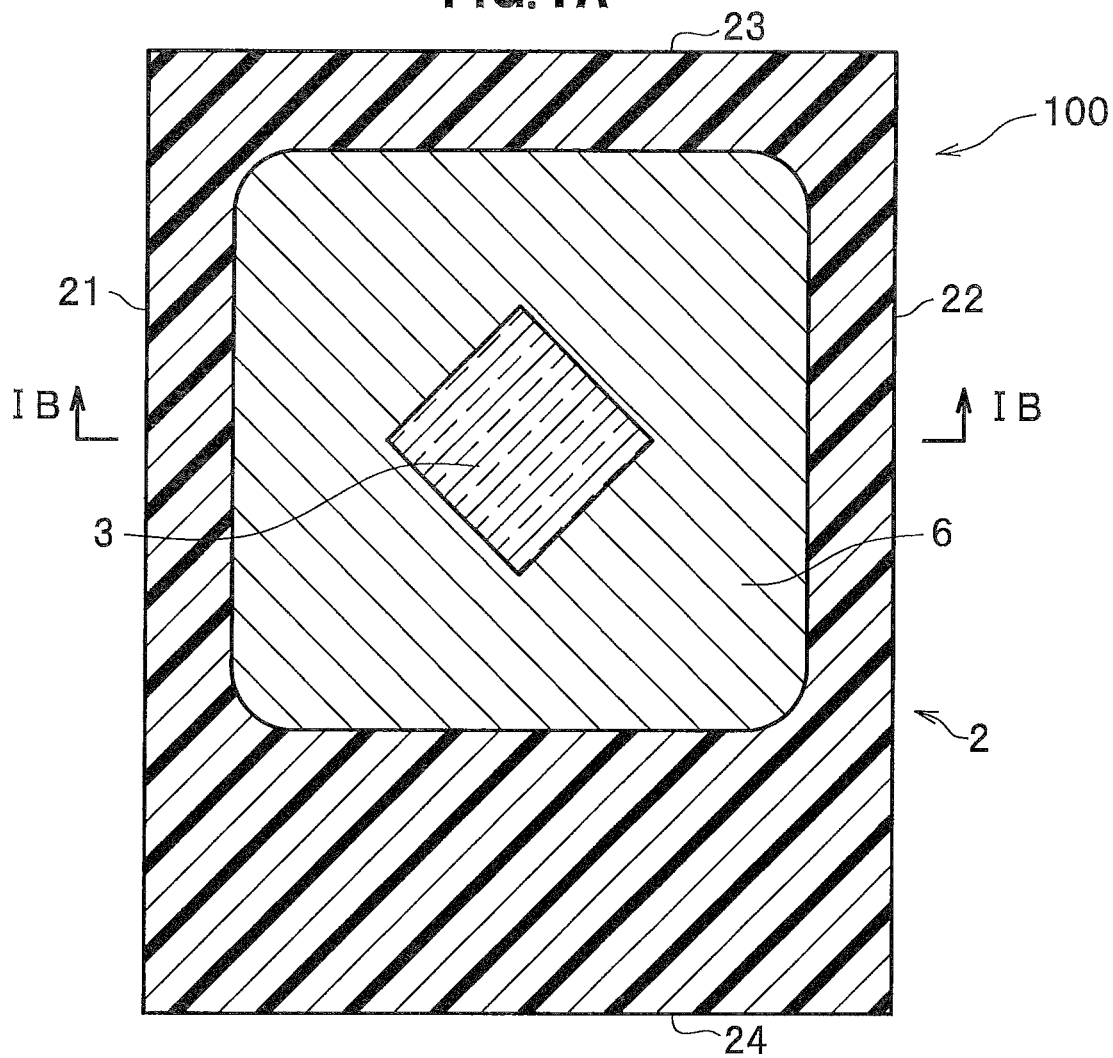
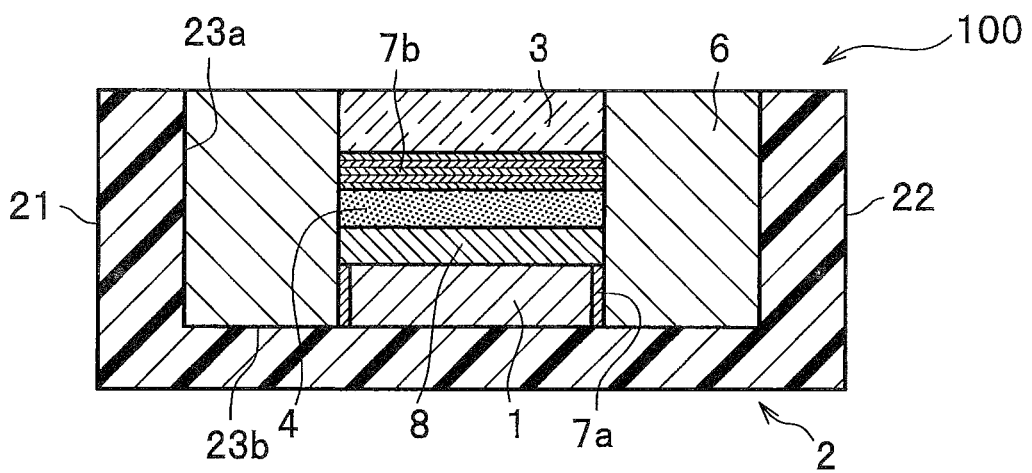

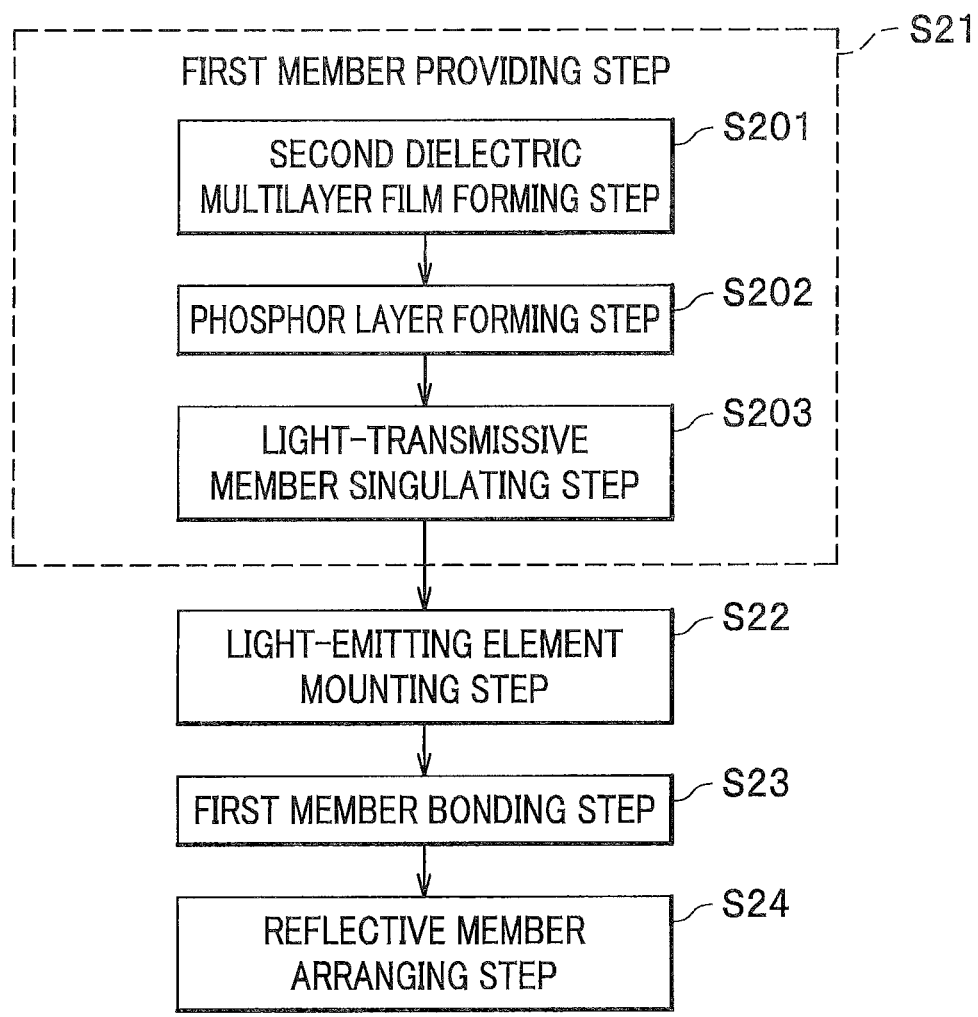

LIGHT-EMITTING DEVICE HAVING A DIELECTRIC MULTILAYER FILM ARRANGED ON THE SIDE SURFACE OF THE LIGHT-EMITTING ELEMENT

CROSS-REFERENCE TO RELATED APPLICATION

This application claims priority under 35 U.S.C. § 120 to U.S. patent application Ser. No. 16/280,045 filed on Feb. 20, 2019, and under 35 U.S.C. § 119 to Japanese Patent Application No. 2018-029186 filed on Feb. 21, 2018, the contents of which are hereby incorporated herein by reference in their entirety.

BACKGROUND

Technical Field

The present disclosure relates to a light-emitting device, and a method of manufacturing the light-emitting device.

Description of Background

Because of their low power consumption and long life, light-emitting devices using, for example, light-emitting diodes (LEDs) as their light sources have drawn attention as a next-generation illumination alternative to a fluorescent lamp. Japanese Unexamined Patent Application Publication No. 2010-157638 (hereinafter referred to as PTL 1) discloses a light-emitting device which obtains desired light emission color, for example, by combining a light-emitting element arranged on a wiring board with a wavelength conversion material arranged on the light-emitting element. The wavelength of LED light emitted from the light-emitting element is changed by the wavelength conversion material arranged on the side of a light-emitting surface of the light-emitting element, and fluorescence thus produced is outputted together with the LED light. The light-emitting element and the wavelength conversion material are fixed to the wiring board by a first covering member.

This light-emitting device further includes a second covering member arranged on its side surfaces adjacent to the light emitting surface of the light-emitting element, and made of resin containing light reflective material. Part of the LED light emitted from the light-emitting element travels sideward, and is reflected toward a light extraction surface by the first and second covering members. The wavelength of the reflected part of the light is converted by the light conversion material, and fluorescence thus produced is also outputted together with the LED light.

Meanwhile, Japanese Unexamined Patent Application Publication No. 2015-225862 (hereinafter referred to as PTL2) discloses a light-emitting device in which: a light-emitting element is arranged under a lower surface of a light-transmissive substrate; the light-emitting element is placed on a support member; and all the surfaces of the light-transmissive substrate and the light-emitting element are coated with a light reflecting layer by atomic layer deposition.

SUMMARY OF INVENTION

According to one aspect of the present invention, a light emitting device includes a light-transmissive member, a phosphor layer, a reflective member, a light-emitting element, and a first dielectric multilayer film. The light-transmissive member includes a first surface, a second surface opposite to the first surface, and third surfaces connected to the first surface and the second surface. The phosphor layer faces the second surface of the light-transmissive member. The reflective member faces side surfaces of the phosphor layer and the third surfaces of the light-transmissive member. The light-emitting element has a top surface facing the phosphor layer, a bottom surface opposite to the top surface, and side surfaces connecting the top surface and the bottom surface. The phosphor layer has a bonding surface facing the light emitting element. The first dielectric multilayer film is arranged on at least one of the side surfaces of the light-emitting element without being provided on the bonding surface of the phosphor layer.

According to another aspect of the present invention, a light emitting device includes a light-transmissive member, a phosphor layer, a reflective member, a light-emitting element, and a first dielectric multilayer film. The light-transmissive member includes a first surface, a second surface opposite to the first surface, and third surfaces connected to the first surface and the second surface. The phosphor layer faces the first surface of the light-transmissive member. The reflective member faces side surfaces of the phosphor layer and the third surfaces of the light-transmissive member. The light-emitting element has a top surface facing the phosphor layer, a bottom surface opposite to the top surface, and side surfaces connecting the top surface and the bottom surface. The phosphor layer has a bonding surface facing the light emitting element. The first dielectric multilayer film is arranged on at least one of the side surfaces of the light-emitting element without being provided on the bonding surface of the phosphor layer.

According to further aspect of the present invention, a light emitting device includes a phosphor block, a reflective member, a light-emitting element, and a first dielectric multilayer film. The phosphor block has an upper surface, a lower surface opposite to the upper surface, and side surfaces connecting the upper surface and the lower surface. The reflective member is arranged on the side surfaces of the phosphor block. The light-emitting element is arranged under the lower surface of the phosphor block. The lower surface of the phosphor block has a bonding surface facing the light-emitting element. The first dielectric multilayer film is arranged on at least one of side surfaces of the light-emitting element without being provided on the bonding surface of the phosphor block.

According to further aspect of the present invention, a method of manufacturing a light-emitting device includes providing a first member including a light-transmissive member and a phosphor layer. The light-transmissive member includes a first surface, a second surface opposite to the first surface, and third surfaces connected to the first surface and the second surface. The phosphor layer faces the second surface of the light-transmissive member. A light-emitting element is mounted on a base. The light-emitting element has a bottom surface facing the base, a top surface opposite to the bottom surface, and side surfaces contacting the top surface and the bottom surface. A first dielectric multilayer film is provided on at least one of the side surfaces of the light-emitting element. The light-emitting element is bonded to the first member. A reflective member is provided to cover at least parts of side surfaces of the phosphor layer and the third surfaces of the light-transmissive member.

According to further aspect of the present invention, a method of manufacturing a light-emitting device includes providing a second member including a light-transmissive member, a phosphor layer, a light-emitting element, and a first dielectric multilayer film. The light-transmissive member includes a first surface, a second surface opposite to the first surface, and third surfaces connected to the first surface and the second surface. The phosphor layer faces the second surface of the light-transmissive member. The light-emitting element has a top surface facing the phosphor layer, a bottom surface opposite to the top surface, and side surfaces connecting the top surface and the bottom surface. The first dielectric multilayer film is provided on at least one of the side surfaces of the light-emitting element. The light-emitting element of the second member is mounted on a base. A reflective member is provided to cover at least parts of side surfaces of the phosphor layer and the third surfaces of the light-transmissive member.

According to further aspect of the present invention, a method of manufacturing a light-emitting device includes mounting on a base, a light-emitting element with a first dielectric multilayer film arranged on at least one of side surfaces of the light-emitting element. The light-emitting element is bonded to a phosphor block. A reflective member is provided to cover at least parts of side surfaces of the phosphor block.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1A is a plan view showing a configuration of a light-emitting device according to a first embodiment.

FIG. 1B is a cross-sectional view of the light-emitting device according to the first embodiment, taken along the IB-IB line of FIG. 1A.

FIG. 3 is a flowchart showing a procedure for a method of manufacturing a light-emitting device according to the first embodiment.

DETAILED DESCRIPTION OF THE EMBODIMENTS

Figure 2A:
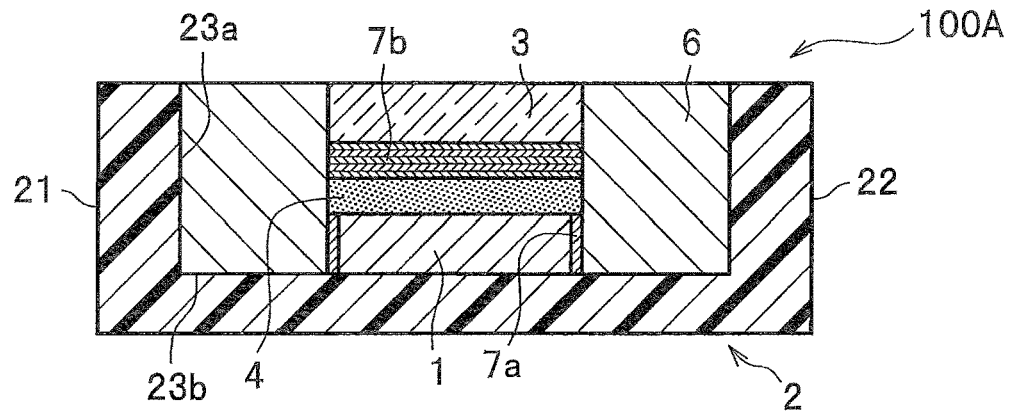
FIG. 2A is a cross-sectional view showing a configuration of a modification of the light-emitting device according to the first embodiment.

The embodiments will now be described with reference to the accompanying drawings, wherein like reference numerals designate corresponding or identical elements throughout the various drawings.

In the light-emitting device of PTL1, out of light from the light-emitting element which travels sideward, its part passing through the first covering member and emitted onto the second covering member may not be preferably incident on the wavelength conversion material since the part is reflected toward the wiring board. Meanwhile, in the light-emitting device of PL2, the light reflecting layer is formed after the light-emitting element is arranged under the lower surface of the light-transmissive substrate. Thus, PTL2 does not state the light reflecting layer is formed on only the light-emitting element.

An object of embodiments disclosed herein is to provide a light-emitting device and a method for manufacturing the light-emitting device both capable of reducing light which leaks from side surfaces of a light-emitting element.

Descriptions will be hereinbelow provided for light-emitting devices and method of manufacturing a light-emitting devices according to embodiments. It should be noted that the drawings to be referred to in the following descriptions schematically illustrate the embodiments. For this reason, scales of members, spaces and positional relationships between members, and the like may be exaggerated, while illustrations of parts of members may be omitted. In addition, scales of members and spaces between members in plan views may not coincide with scales of members and spaces between members in cross-sectional views. Furthermore, in the following descriptions, the same names and reference signs basically denote the same or similar members, and detailed descriptions will be omitted whenever deemed appropriate. Moreover, in this specification, "up," "down" and the like indicate positions of components relative to one another, and are not intended to indicate absolute positions. Incidentally, in this specification, a first surface is assumed as being a front surface, and opposite means a second surface which is the back surface opposite to the front surface.

First Embodiment

Configuration of Light-Emitting Device

To begin with, referring to FIGS. 1A and 1B, descriptions will be provided for a configuration of a light-emitting device 100 according to a first embodiment. FIG. 1A is a plan view showing a configuration of the light-emitting device according to the first embodiment. FIG. 1B is a cross-sectional view showing the configuration of the light-emitting device according to the first embodiment, taken along the IB-IB line of FIG. 1A. Incidentally, hatching lines over each member in FIG. 1A coincide with hatching lines over the corresponding member in FIG. 1B.

The light-emitting device 100 includes: a light-transmissive member 3 including a first surface, a second surface opposite to the first surface, and third surfaces connected to the first and second surfaces; a phosphor layer 4 facing the second surface of the light-transmissive member 3; a reflective member 6 facing the side surfaces of the phosphor layer 4 and the third surfaces of the light-transmissive member 3; a light-emitting element 1 facing the phosphor layer 4; and a first dielectric multilayer film 7a arranged on at least one side surface of the light-emitting element 1. In the light-emitting device 100, no first dielectric multilayer film 7a is formed on a bonding surface of the phosphor layer 4 which faces the light-emitting element 1. The light-emitting element 1 is arranged, for example, on a base 2.

The light-emitting element 1 includes a first surface, a second surface opposite to the first surface, and third surfaces connected to the first and second surfaces. In this respect, in the light-emitting element 1, the first surface is an upper surface, the second surface is a lower surface thereof, and the third surfaces are side surfaces thereof. The first surface of the light-emitting element 1 faces the phosphor layer 4, the second surface of the light-emitting element 1 is arranged on a bottom surface 23b of a recess 23a in the base 2, and the first dielectric multilayer film 7a is arranged on the third surfaces of the light-emitting element 1. The light-emitting element 1 is electrically connected to wires arranged on the base 2, and emits near-ultraviolet to blue light. In this respect, the near-ultraviolet to blue light is light of colors in an emission wavelength range of near-ultraviolet to blue.

In a plan view, the light-emitting element 1 is substantially square. Incidentally, in the plan view, the shapes of the light-transmissive member 3 and the phosphor layer 4 are, for example, the same as that of the light-emitting element 1 although the sizes of the light-transmissive member and the phosphor layer are different from that of the light-emitting element. In the plan view, the light-emitting element 1 may have the same area as the phosphor layer 4, or may have an area smaller than that of the phosphor layer 4. Incidentally, in the plan view, although formed in the shape of a square, the light-emitting element 1 may be formed in the shape of a polygon such as a triangle or a hexagon, or in the shape of a circle, an ellipse or the like.

The base 2 includes the recess 23a surrounded by a first wall part 21 to a fourth wall part 24, and in the plan view, the inner shape of the interior of the recess 23a is formed substantially in the shape of a square. In the plan view, the outer shape of the base 2 is also formed in the shape of a square. The first to third wall parts 21, 22, 23 of the base 2 is formed thinner than the fourth wall part 24 thereof. Incidentally, in the plan view, although the light-emitting element 1 is arranged with its side surfaces respectively facing the corner portions of the base 2, the light-emitting element 1 may be arranged with its side surfaces respectively facing the wall parts of the base. In the case where the side surfaces of the light-emitting element 1 respectively face the corner portions of the recess 23a, it is possible to make the distance from each side surface to the base 2 longer, and to increase a rate of light reflected by the reflective member 6.

The base 2 is formed from a material such as ceramic, thermosetting resin and thermoplastic resin. Incidentally, the base 2 may be so shaped like a flat plate that the base includes no recess 23a.

The light-transmissive member 3 has a flat plate shape, and includes a first surface, a second surface opposite to the first surface, and third surfaces connected to the first and second surfaces. In the light-transmissive member 3, the first surface is an upper surface thereof, the second surface is a lower surface thereof, and the third surfaces are side surfaces thereof. The second surface of the light-transmissive member 3 faces the phosphor layer 4, and the reflective member 6 is formed facing the third surface of the light-transmissive member 3. Furthermore, a second dielectric multilayer film 7b is arranged between the second surface of the light-transmissive member 3 and the phosphor layer 4. The provision of the second dielectric multilayer film 7b makes it possible to return the light from the light-emitting element 1 to the phosphor layer 4 after the light passes through the phosphor layer 4 without leaking the light to the outside, and accordingly to cause the phosphor layer 4 to efficiently change wavelengths of the light from the light-emitting element 1.

It should be noted that the dielectric multilayer films may transmit light depending on the angle and wavelength of the light. For this reason, the light passing through the dielectric multilayer films can be employed more effectively in a configuration where predetermined parts of the light-transmissive member and the phosphor layer are not covered with the dielectric multilayer films than in a configuration where all of the light-transmissive member and the phosphor layer are covered with the dielectric multilayer films.

It is desirable that the light-transmissive member 3 be made of a material having an excellent light transmission property (with a transmittance of 60% or more, preferably 70% or more, and more preferably 80% or more). Examples of the material include glass, ceramic, acrylic resin, silicone resin, and epoxy resin.

The phosphor layer 4, for example, is bonded to the light-emitting element 1 using a bonding member 8. The phosphor layer 4 absorbs at least part of the near-ultraviolet to blue light emitted from the light-emitting element 1, and emits blue-green to red light. In this respect, the blue-green to red light is light of colors in an emission wavelength range of blue green to red. As more of the near-ultraviolet to blue light emitted from the light-emitting element 1 is incident on the phosphor layer 4, the phosphor layer 4 can excite the phosphor more efficiently to emit more of the blue-green to red light. However, it is desirable that the light emitted from the light-emitting device be yellow-red to red light obtained by reducing the light from the light-emitting element and increasing the light from the phosphor layer. The visibility of the light emitted from the light-emitting device can be increased when the light is yellow-red to red light obtained by reducing the blue light emitted from the light-emitting element as much as possible. The reduction in the light emitted from the light-emitting element can be achieved when in the spectrum of the light emitted from the light-emitting device, the integral value of the light caused by the light-emitting element is 10% or less, or preferably 5% or less, of the integral value of the light caused by the phosphor layer. Incidentally, in a case where the peak wavelength of the light emitted from the light-emitting element is shorter than 420 nm, the light emitted from the light-emitting element is less visible. With this taken into consideration, in the spectrum of the light emitted from the light-emitting device, the integral value of the light caused by the light-emitting element may be 20% or less of the integral value of the light caused by the phosphor layer.

It is desirable that the base material of the phosphor layer 4 be a material having an excellent light transmission property. Examples of the material include silicone resin, epoxy resin, phenol resin, polycarbonate resin, acrylic resin, fluororesin, their modified resins, and their hybrid resins. Particularly, it is desirable that silicone resin be used as the base material of the phosphor layer 4, since the silicone resin is excellent in weather resistance, heat resistance and light stability. Incidentally, the phosphor layer 4 may be made of a mixture of phosphor and the base material, or from only phosphor.

The phosphor contained in the phosphor layer 4 is a material which absorbs at least part of the near-ultraviolet to blue light emitted from the light-emitting element 1 and emits the blue-green to red light. Examples of the material of the phosphor include $CaAlSiN_3$:Eu phosphor ("CASN phosphor"), (Sr, Ca)$AlSiN_3$:Eu phosphor ("SCASN phosphor"), $K_2SiF_6$:Mn phosphor ("KSF phosphor"), and their combinations.

Furthermore, in a case where white light emission from the combination with a blue-light emitting element is intended, examples of the material of the phosphor include cerium-doped YAG (yttrium, aluminum and garnet) phosphor and LAG (ruthenium, aluminum and garnet) phosphor, and silicate phosphor.

The reflective member 6 faces the side surfaces of the phosphor layer 4 and the third surfaces of the light-transmissive member 3. The reflective member 6 is contiguous to the phosphor layer 4 and the light-transmissive member 3, and is capable of increasing the amount of light emitted upward from the light-emitting element 1. In the case where the base 2 includes the recess 23a, it is more desirable that the reflective member 6 be filled into the recess 23a of the base 2 to cover the first dielectric multilayer film 7a. This makes it possible for the reflective member 6 to efficiently reflect light leaking from the first dielectric multilayer film 7a, and thereby to increase the light outputting efficiency of the light-emitting device 100.

It is desirable that the base material of the reflective member 6 be a material having an excellent light transmission property. Examples of the material include silicone resin, silicone-modified resin, silicone hybrid resin, epoxy resin, epoxy-modified resin, urea resin, diallyl phthalate resin, phenol resin, and unsaturated polyether resin.

It is desirable that the light reflective material of the reflective member 6 be a material whose refractive index is largely different from that of the base material. Examples of the light reflective material include titanium oxide, silicon dioxide, zirconium dioxide, potassium titanate, alumina, aluminium nitride, and boron nitride. In order to make the light-emitting element 1 emit blue light, it is desirable that titanium oxide in particular be used as the light reflective material since titanium oxide is stable against moisture and the like, and is excellent in heat conductivity as well. In order to make the light-emitting element 1 emit near-ultraviolet light, it is desirable that zirconium dioxide be used as the light reflective material since zirconium dioxide has a high reflectance in near-ultraviolet. Incidentally, the mean particle diameter of the light reflective material is preferably 0.001 µm or more but 10 µm or less, and more preferably 0.1 µm or more but 1 µm or less. In the case where the mean particle diameter is in this range, it is possible to improve the light scattering effect of the reflective member, and thus to enhance the light outputting efficiency of the light-emitting device 100.

The first dielectric multilayer film 7a is arranged on at least one side surface of the light-emitting element 1. It is desirable that the first dielectric multilayer film 7a be arranged on two side surfaces of the light-emitting element 1, on three side surfaces of the light-emitting element 1, or on all of the side surfaces of the light-emitting element 1. The first dielectric multilayer film 7a makes the near-ultraviolet to blue light, emitted from the light-emitting element 1, to be efficiently incident on the phosphor layer 4. Specifically, the first dielectric multilayer film 7a has a high reflectance to the near-ultraviolet to blue light emitted from the light-emitting element 1, and has a high transmittance to the blue-green to red light, particularly the yellow-red to red light, emitted from the phosphor layer 4. The reflectance of the first dielectric multilayer film 7a to the near-ultraviolet to blue light is preferably 90% or more when the angle of incidence of the near-ultraviolet to blue light is in a range of 0° to 30°, and more preferably 95% or more when the angle of incidence of the near-ultraviolet to blue light is in a range of 0° to 30°.

The first dielectric multilayer film (distributed Bragg reflector (DBR) film) 7a is formed by alternately depositing at least two types of dielectric layers. Examples of the material used for the dielectric layers include $SiO_2$, $TiO_2$ and Nb$_2$O$_5$. Incidentally, the number of dielectric layers to be deposited is not particularly limited.

The light-emitting device 100 may include the second dielectric multilayer film 7b disposed between the light-transmissive member 3 and the phosphor layer 4. Like the first dielectric multilayer film 7a, the second dielectric multilayer film 7b has a high reflectance to the near-ultraviolet to blue light emitted from the light-emitting element 1, and has a high transmittance to the blue-green to red light emitted from the phosphor layer 4. The second dielectric multilayer film 7b makes the near-ultraviolet to blue light, emitted from the light-emitting element 1, to be efficiently incident on the phosphor layer 4.

The bonding member 8 is a member boding the light-emitting element 1 and the phosphor layer 4 together. It is desirable that the refractive index of the bonding member 8 be between the ones of the light-emitting element 1 and the phosphor layer 4. Such a refractive index makes it possible to reduce the difference between the refractive indices of the light-emitting element 1 and the bonding member 8, and the difference between the refractive indices of the bonding member 8 and the phosphor layer 4. This reduction enables more of the near-ultraviolet to blue light emitted from the light-emitting element 1 to be incident on the phosphor layer 4. Furthermore, it is desirable that the bonding member 8 be made of a material having an excellent light transmission property. Examples of the material include silicone resin, epoxy resin, acrylic resin and polyimide resin.

In the light-emitting device 100 according to the first embodiment, the first dielectric multilayer film 7a is arranged facing at least one side surface of the light-emitting element 1. This makes it possible to reduce light leaking from the side surfaces of the light-emitting element 1 even if the thicknesses of the members arranged facing the side surfaces of the light-emitting element 1 are reduced. Meanwhile, if the side surfaces of the light-emitting element 1 were directly covered with the reflective member 6 with no first dielectric multilayer film 7a provided in between, light from the light-emitting element 1 would leak to the outside from near the interfaces between the side surfaces of the light-emitting element 1 and the reflective member 6. In contrast to this, the light-emitting device according to the first embodiment can reduce light leaking from the side surfaces of the light-emitting element 1 since the first dielectric multilayer film 7a is provided on the surfaces of the light-emitting element 1. Thus, the light-emitting device 100 including the first dielectric multilayer film 7a can improve the color purity of the color of the emitted light.

Modifications

Figure 2B:
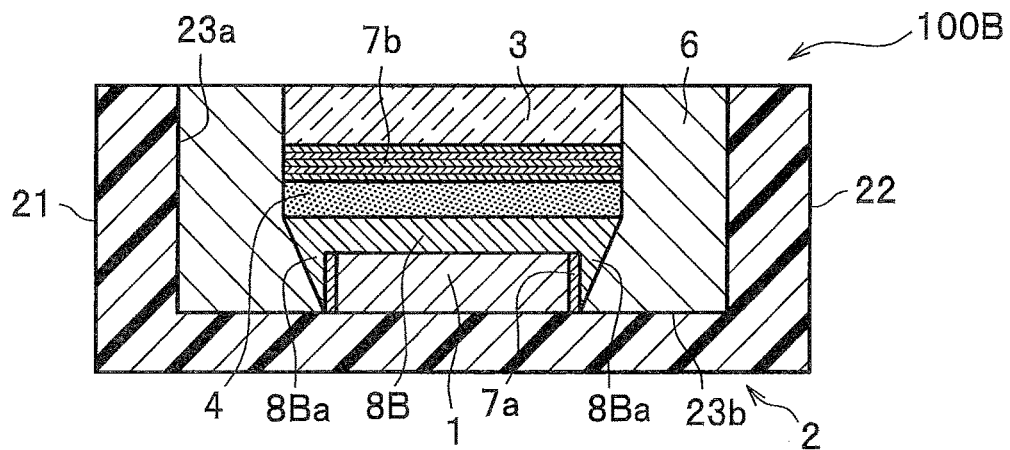
FIG. 2B is a cross-sectional view showing a configuration of another modification of the light-emitting device according to the first embodiment.
Figure 2C:
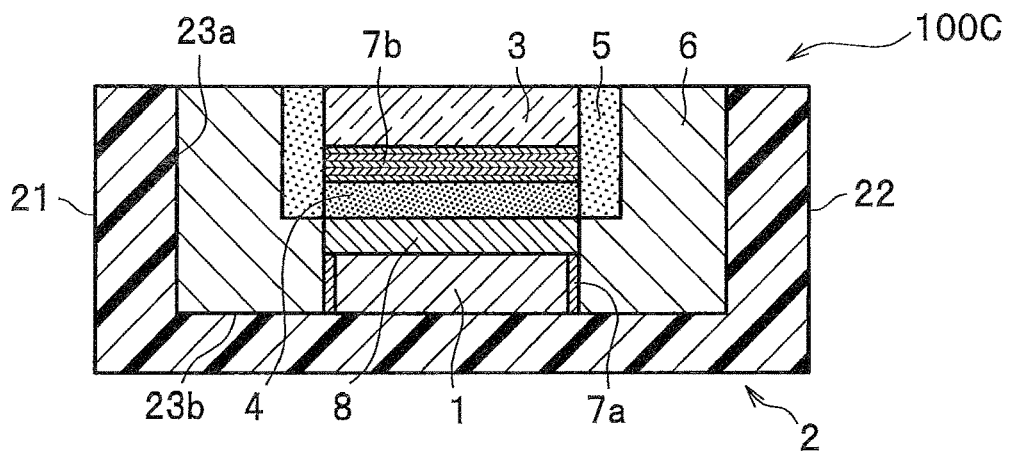
FIG. 2C is a cross-sectional view showing a configuration of the other modification of the light-emitting device according to the first embodiment.

Next, referring to FIGS. 2A, 2B and 2C, descriptions will be provided for modifications of the light-emitting device 100 according to the first embodiment. As for a first modification, descriptions will be provided for a light-emitting device 100A obtained by modifying the method of bonding the light-emitting element 1 and the phosphor layer 4 in the light-emitting device 100 illustrated in FIGS. 1A and 1B. As for a second modification, descriptions will be provided for a light-emitting device 100B obtained by changing the shape of the bonding member 8 in the light-emitting device 100 illustrated in FIGS. 1A and 1B. As for a third modification, descriptions will be provided for a light-emitting device 100C obtained by providing a covering layer 5 to the light-emitting device 100 illustrated in FIGS. 1A and 1B.

First Modification

FIG. 2A is a cross-sectional view showing a configuration of a modification of the light-emitting device 100 according to the first embodiment. Referring to FIG. 2A, descriptions will be provided for the light-emitting device 100A according to the first modification.

In the light-emitting device 100A according to the first modification, the light-emitting element 1 and the phosphor layer 4 are directly bonded to each other without using the bonding member 8. Incidentally, the first dielectric multilayer film 7a is provided on at least one side surface of the light-emitting element 1. Since no bonding member 8 is arranged between the light-emitting element 1 and the phosphor layer 4, blue light emitted from the light-emitting element 1 is directly incident on the phosphor layer 4. This makes it possible to reduce uneven light emission from the light-emitting device 100A. This also makes it possible to reduce a decrease in luminous flux which would occur due to deterioration of the bonding member.

Examples of the direct bonding method include surface activation bonding, hydroxyl bonding, and atomic diffusion bonding. Surface activation bonding is a method of: making the bonding surfaces easy to chemically bond by treating the bonding surfaces in vacuum; and thereafter bonding the bonding surfaces together. Hydroxyl bonding is a method of: forming hydroxyl groups on the bonding surfaces by atomic layer deposition or the like; and thereafter bonding the hydroxyl groups on the bonding surfaces together. Atomic diffusion bonding is a method of: forming metal layers with a film thickness corresponding to one atomic layer on the respective bonding surfaces; and bringing the bonding surfaces into contact with each other in vacuum or in inert gas atmosphere to bond the metal atoms. Use of the direct bonding methods like this makes it possible to integrate the light-emitting element 1 and the phosphor layer 4 into a single unit under an environment close to room temperature.

It should be noted that in the light-emitting device according to the embodiment, no first dielectric multilayer film 7a being formed on the lower surface (bonding surface) of the phosphor layer 4 means that no film surface of the first dielectric multilayer film 7a is bonded to the lower surface of the phosphor layer 4. Although as illustrated in FIG. 2A, the upper surface of the first dielectric multilayer film 7a touches the lower surface of the phosphor layer 4, the first dielectric multilayer film 7a cannot perform its original function. This is equivalent to no first dielectric multilayer function 7a being formed.

Second Modification

FIG. 2B is a cross-sectional view showing a configuration of another modification of the light-emitting device 100 according to the first embodiment. Referring to FIG. 2B, descriptions will be provided for the light-emitting device 100B according to the second modification.

In the light-emitting device 100B according to this modification, the light-transmissive member 3, the second dielectric multilayer film 7b and the phosphor layer 4 are formed larger than the combination of the light-emitting element 1 and the first dielectric multilayer film 7a. Furthermore, in the light-emitting device 100B, a bonding member 8B is arranged covering the first surface of the light-emitting element 1 and the outer side of the first dielectric multilayer film 7a. The bonding member 8B includes a fillet 8Ba formed covering the outer side of the first dielectric multilayer film 7a from its outer edge, and thereby enables the near-ultraviolet to blue light emitted from the light-emitting element 1 to be easily incident on the phosphor layer 4. Furthermore, although in a plan view, the area of the light-emitting element 1 is smaller than the area of the phosphor layer 4, the bonding member 8B enables the blue light emitted from the light-emitting element 1 to be efficiently incident on the phosphor layer 4 or the covering layer 5.

In addition, in a cross-sectional view, in the bonding member 8B arranged on the first dielectric multilayer film 7a, its parts corresponding to the filets 8Ba are shaped substantially like a triangle. Use of this shape enables more of the blue light emitted from the light-emitting element 1 to be reflected by the interface between the boning member 8B and the reflective member 6. This makes it possible to enhance the light emitting efficiency of the light-emitting device 100B, and to improve the luminance brightness of the light emitted from the light-emitting device. Incidentally, the size of the fillet 8Ba of the bonding member 8B is adjustable depending on the amount of the bonding member, and is appropriately determined depending on the wettability and viscosity of the bonding surface of the light-emitting element 1, as well as the wettability and viscosity of the bonding surface of the phosphor layer 4.

Particularly since no dielectric multilayer film is provided on the lower surface of the phosphor layer 4, the light from the side surfaces of the light-emitting element 1 and the light from the phosphor layer 4 can be reflected by the reflective member 6 and thereby returned to the phosphor layer 4 again. This makes it possible to efficiently change the wavelengths of the light from the light-emitting element 1.

Third Modification

FIG. 2C is a cross-sectional view showing a configuration of the other modification of the light-emitting device 100 according to the first embodiment. Referring to FIG. 2C, descriptions will be provided for the light-emitting device 100C according to the third modification.

In the light-emitting device 100C according to this modification, the covering layer 5 is provided between the reflective member 6 and the side surfaces of the phosphor layer 4, between the reflective member 6 and the side surfaces of the second dielectric multilayer film 7b, as well as between the reflective member 6 and the third surfaces of the light-transmissive member 3. The covering layer 5 shaped like a squared ring is arranged on the side surfaces of the phosphor layer 4, the side surfaces of the second dielectric multilayer film 7b, and the third surfaces of the light-transmissive member 3. The covering layer 5 absorbs at least part of the near-ultraviolet to blue light emitted from the light-emitting element 1, and emits or exhibits the blue-green to red light.

The covering layer 5 may be a member similar to the phosphor layer 4, or a pigment layer. In the case where the covering layer 5 is a member similar to the phosphor layer 4, the phosphor absorbs at least part of the near-ultraviolet to blue light, and emits the blue-green to red light. On the other hand, in the case where the covering layer 5 is a pigment layer, the pigment absorbs at least part of the near-ultraviolet to blue light, and exhibits the blue-green to red light without emitting light. Incidentally, in the case where the covering layer 5 contains phosphor, it is desirable that the density of phosphor in the phosphor layer 4 be higher than the density of phosphor in the covering layer 5.

The base material of the covering layer 5 is preferable a material having an excellent light transmission property. Examples of the material include silicone resin, epoxy resin, phenol resin, polycarbonate resin, acrylic resin, fluororesin, their modified resins, and their hybrid resins. Particularly, it is desirable that silicone resin be used as the base material of the covering layer 5, since silicone resin is excellent in weather resistance, heat resistance and light stability.

Examples of the material to be used for the phosphor contained in the covering layer 5 include CASN phosphor, SCASN phosphor, KSF phosphor, YAG phosphor, LAG phosphor, silicate phosphor, and their combinations. Meanwhile, examples of the material to be used for the pigment contained in the covering layer 5 include perylene pigment, titanium aluminum antimony pigment, and their combinations.

Method of Manufacturing Light-Emitting Device

Next, referring to FIG. 3 to FIG. 5C, descriptions will be provided for a method of manufacturing a light-emitting device according to the first embodiment. Incidentally, the order of some steps is not limited, and may be reversed.

The method of manufacturing the light-emitting device according to the first embodiment includes a first member providing step (S21), a light-emitting element mounting step (S22), a first member bonding step (S23), and a reflective member arranging step (S24). The first member providing step (S21) includes a second dielectric multilayer film forming step (S201), a phosphor layer forming step (S202), and a light-transmissive member singulating step (S203).

The first member providing step (S21) is a step of providing a first members including: the light-transmissive member 3 including the first surface, the second surface opposite to the first surface, and the third surfaces connected to the first and second surfaces; and the phosphor layer 4 facing the second surface of the light-transmissive member 3.

Specific descriptions will be hereinbelow provided for the first member providing step (S21).

Figure 4A:
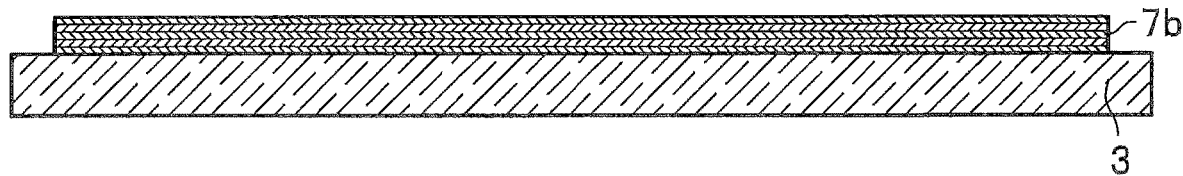
FIG. 4A is a cross-sectional view showing a second dielectric multilayer film forming step in the method of manufacturing the light-emitting device according to the first embodiment.

As illustrated in FIG. 4A, the second dielectric multilayer film forming step (S201) is a step of forming the second dielectric multilayer film 7b on the light-transmissive member 3. In the second dielectric multilayer film forming step (S201), the second dielectric multilayer film 7b is fonned by depositing at least two types of dielectric layers on the light-transmissive member 3 by atomic layer deposition (ALD), sputtering, or the like.

Figure 4B:
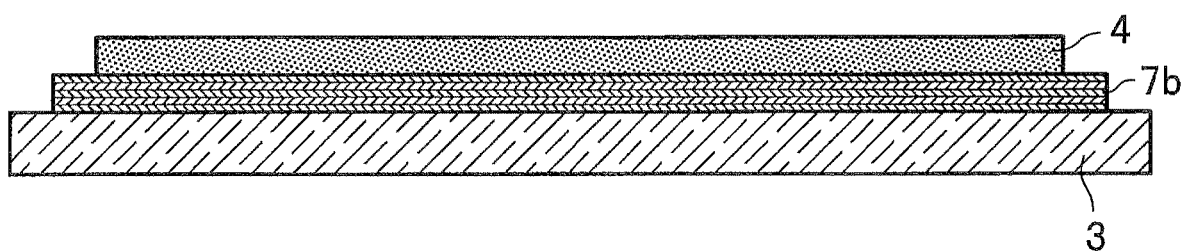
FIG. 4B is a cross-sectional view showing a phosphor layer forming step in the method of manufacturing the light-emitting device according to the first embodiment.

As illustrated in FIG. 4B, the phosphor layer forming step (S202) is a step of forming the phosphor layer 4 on the second dielectric multilayer film 7b. In the phosphor layer forming step (S202), the phosphor layer 4 is formed by applying resin with red phosphor added therein onto the second dielectric multilayer film 7b by screen printing, or the like.

Figure 4C:
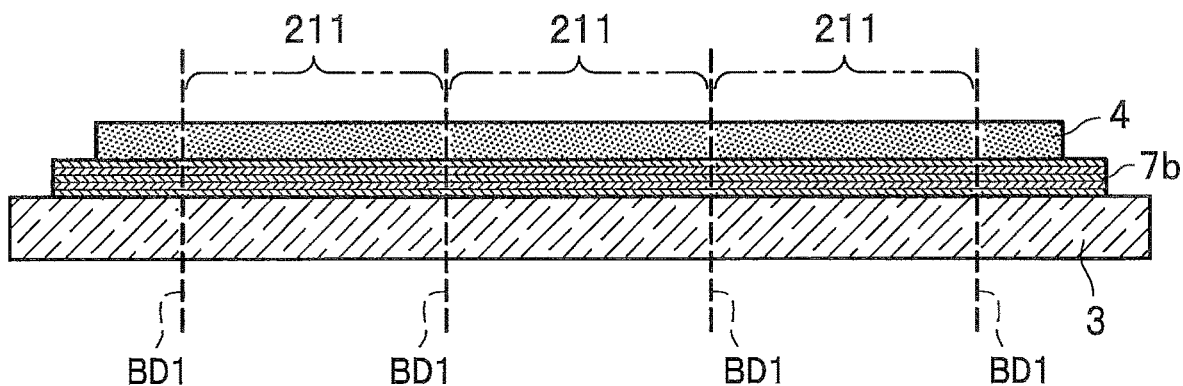
FIG. 4C is a cross-sectional view showing a light-transmissive member singulating step in the method of manufacturing the light-emitting device according to the first embodiment.

As illustrated in FIG. 4C, the light-transmissive member singulating step (S203) is a step of singulating the light-transmissive member 3 with the second dielectric multilayer film 7b and the phosphor layer 4 formed thereon. In the light-transmissive member singulating step (S203), the light-transmissive member 3 with the second dielectric multilayer film 7b and the phosphor layer 4 formed thereon is singulated along dividing lines BD1 by blade dicing, laser dicing, or the like. Thereby, the first members 211 are formed.

Figure 5A:
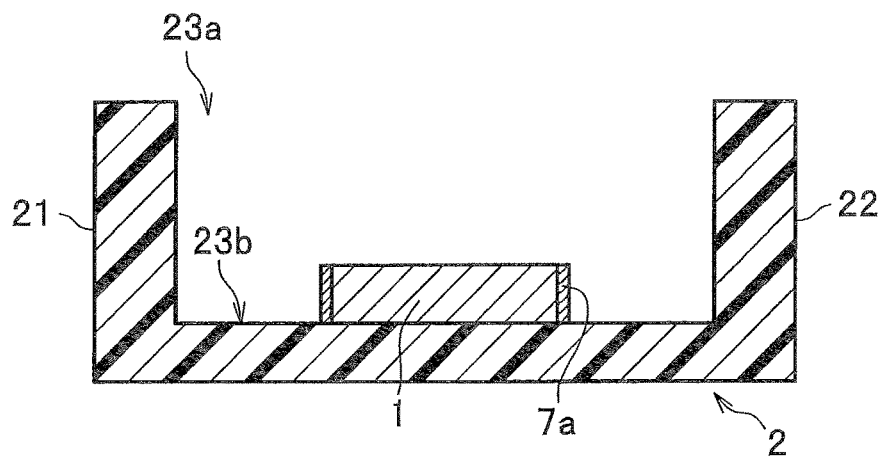
FIG. 5A is a cross-sectional view showing a light-emitting element mounting step in the method of manufacturing the light-emitting device according to the first embodiment.

As illustrated in FIG. 5A, the light-emitting element mounting step (S22) is a step of mounting the light-emitting element 1 with the first dielectric multilayer film 7a arranged on at least one side surface thereof onto the base 2 including the recess 23a. In the light-emitting element mounting step (S22), it is desirable that the method of mounting the light-emitting element 1 be solder flip-flop mounting using reflow. Incidentally, the first dielectric multilayer film 7a is formed on the side surfaces of the light-emitting element 1 by atomic layer deposition, sputtering, or the like. Furthermore, the light-emitting element mounting step (S22) may be performed in parallel with the first member providing step (S21). Otherwise, any one of the first member providing step or the light-emitting element mounting step may come before the other.

Figure 5B:
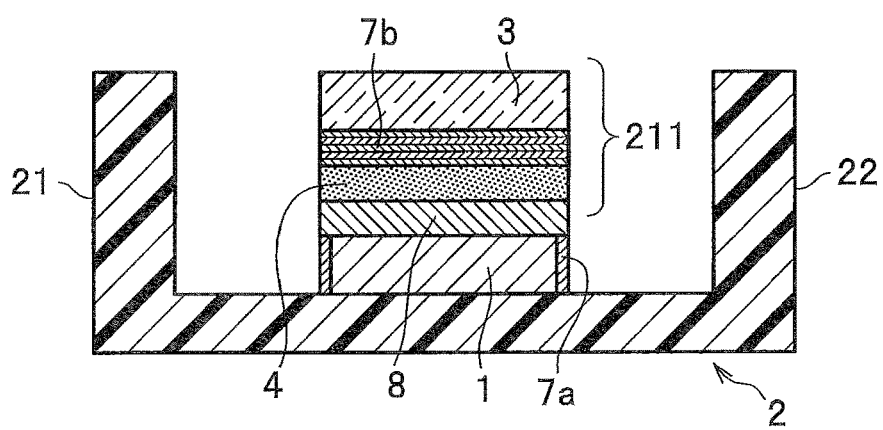
FIG. 5B is a cross-sectional view showing a first member bonding step in the method of manufacturing the light-emitting device according to the first embodiment.

As illustrated in FIG. 5B, the first member bonding step (S23) is a step of bonding the light-emitting element 1 and the first member 211 together. In the first member bonding step (S23), the bonding member 8 is formed on the bonding surface of the light-emitting element 1 and/or the bonding surface of the first member 211 by coating, and the bonding surfaces are bonded together using the bonding member 8. In this respect, the first member 211 and the light-emitting element 1 are bonded together in a way that makes the phosphor layer 4 in the first member 211 face the first surface of the light-emitting element 1.

Figure 5C:
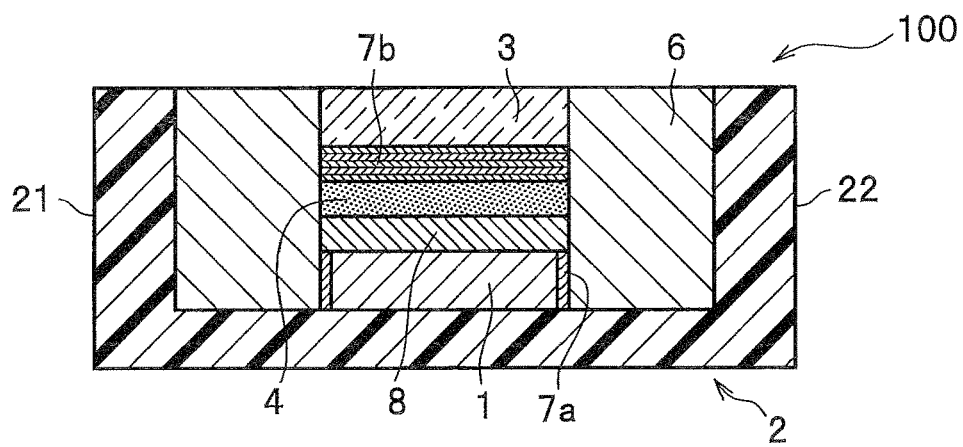
FIG. 5C is a cross-sectional view showing a reflective member arranging step in the method of manufacturing the light-emitting device according to the first embodiment.
Figure 6:
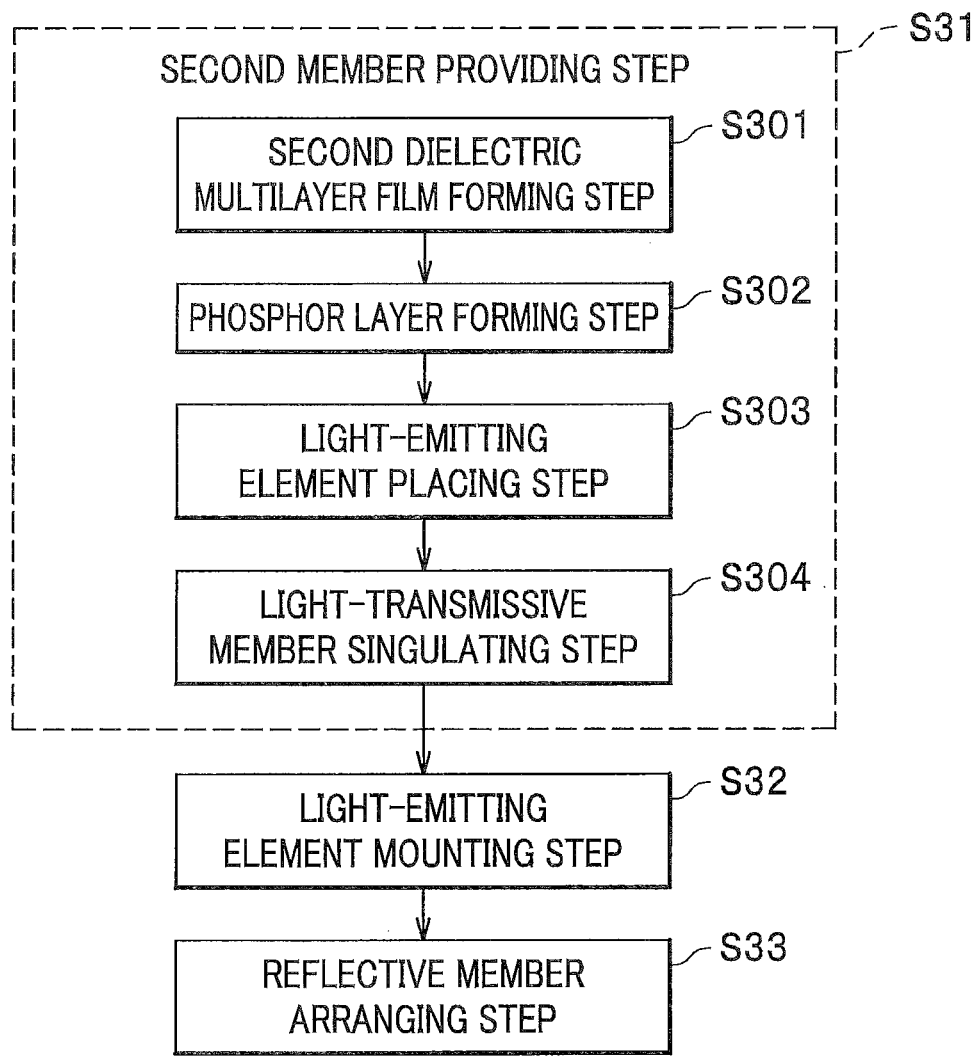
FIG. 6 is a flowchart showing a modification of the method of manufacturing the light-emitting device according to the first embodiment.

As illustrated in FIG. 5C, the reflective member arranging step (S24) is a step of providing the reflective member 6 in the recess 23a of the base 2 until the reflective member 6 covers at least parts of the respective side surfaces of the phosphor layer 4, or in a way that makes the reflective member 6 cover at least parts of the respective third surfaces of the light-transmissive member 3. Incidentally, in the reflective member arranging step (S24), the reflective member 6 is provided in a way that makes the reflective member 6 flush with the upper surface of the light-transmissive member 3. In the reflective member arranging step (S24), first of all, the recess 23a in the base 2 is filled with uncured resin, containing dispersed light-reflective substance, by potting using a dispenser, or the like. Thereafter, the filled resin is formed into the reflective member 6 by being heated at predetermined temperature for a predetermined time length in a heating apparatus such as a heater or a reflow furnace. Incidentally, the reflective member 6 is not formed on the light-transmissive member 3.

It should be noted that in a case where the base 2 is formed in the shape of a flat plate without including the recess 23a, first of all, the inside of the frame arranged surrounding the light-emitting element 1 is filled with uncured resin which contains the dispersed light-reflective substance. After that, the filled resin is formed into the reflective member 6 by: heating the resin at the predetermined temperature for the predetermined time length; and thereafter removing the frame.

As discussed above, the steps are formed to manufacture the light-emitting device 100. Incidentally, the steps do not have to be performed in the above-discussed order. For example, the first member providing step (S21) may be performed after the light-emitting element mounting step (S22) is performed.

Modification

Next, referring to FIGS. 6 to 8B, descriptions will be provided for a modification of the method of manufacturing the light-emitting device according to the first embodiment. In the method of manufacturing the light-emitting device according to the first embodiment, the first member 211 is bonded to the light-emitting element 1 after the light-emitting element 1 is mounted on the base 2. In contrast, in the modification of the method of manufacturing the light-emitting device according to the first embodiment, the light-emitting element 1 included in a second member, although discussed later, is mounted on the base 2. Incidentally, the order of some steps is not limited, and may be reversed.

The modification of the method of manufacturing the light-emitting device according to the first embodiment includes a second member providing step (S31), a light-emitting element mounting step (S32), and a reflective member arranging step (S33). The second member providing step (S31) includes a second dielectric multilayer film forming step (S301), a phosphor layer forming step (S302), a light-emitting element placing step (S303), and a light-transmissive member singulating step (S304).

The second member providing step (S31) is a step of providing the second member which includes: the light-transmissive member 3 including the first surface, the second surface opposite to the first surface, and the third surfaces connected to the first and second surfaces; the phosphor layer 4 facing the second surface of the light-transmissive member 3; the light-emitting elements 1 facing the phosphor layer 4; and the first dielectric multilayer film 7a each arranged on at least one side surface of each light-emitting element 1.

Specific descriptions will be hereinbelow provided for the second member providing step (S31). Incidentally, duplicated descriptions for the same parts as those of the method of manufacturing the light-emitting device according to the first embodiment will be omitted.

Figure 7A:
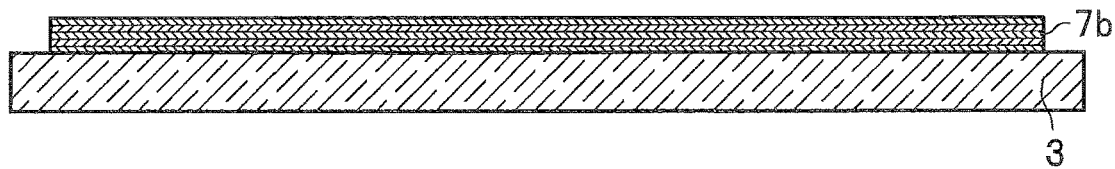
FIG. 7A is a cross-sectional view showing a second dielectric multilayer film forming step in the modification of the method of manufacturing the light-emitting device according to the first embodiment.
Figure 7B:
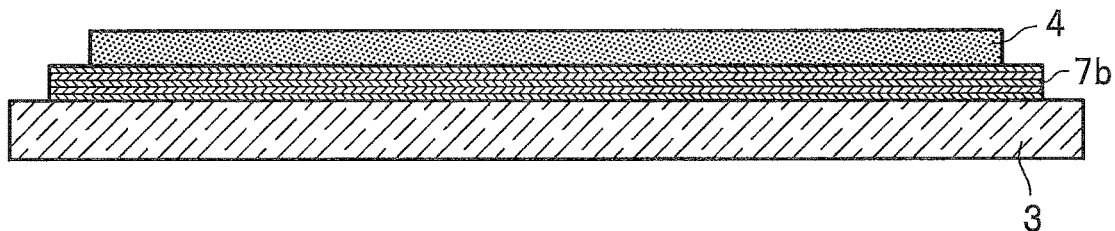
FIG. 7B is a cross-sectional view showing a phosphor layer forming step in the modification of the method of manufacturing the light-emitting device according to the first embodiment.

The steps (S301, S302) illustrated in FIGS. 7A and 7B are the same as the steps (S201, S202) illustrated in FIGS. 4A and 4B, and descriptions will be omitted.

Figure 7C:
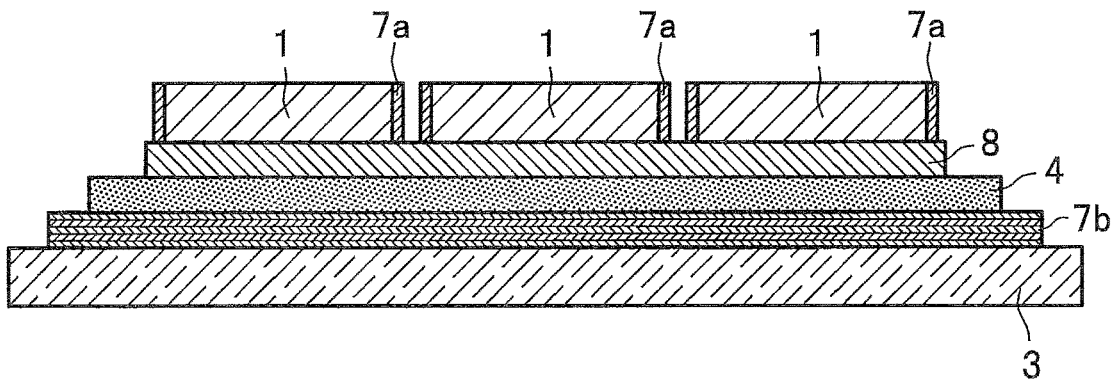
FIG. 7C is a cross-sectional view showing a light-emitting element placing step in the modification of the method of manufacturing the light-emitting device according to the first embodiment.

As illustrated in FIG. 7C, the light-emitting element placing step (S303) is a step of placing the light-emitting elements 1 each with the first dielectric multilayer film 7a arranged on at least one side surface (in this example, all the side surfaces) of the light-emitting element onto the phosphor layer 4. In the light-emitting element placing step (S303), the bonding member 8 is formed on the bonding surfaces of the respective light-emitting elements 1 and/or the bonding surface of the phosphor layer 4 by coating; the bonding surfaces are bonded together using the bonding member 8; and thereby, the light-emitting elements 1 and the first dielectric multilayer films 7a are arranged facing the phosphor layer 4.

Figure 7D:
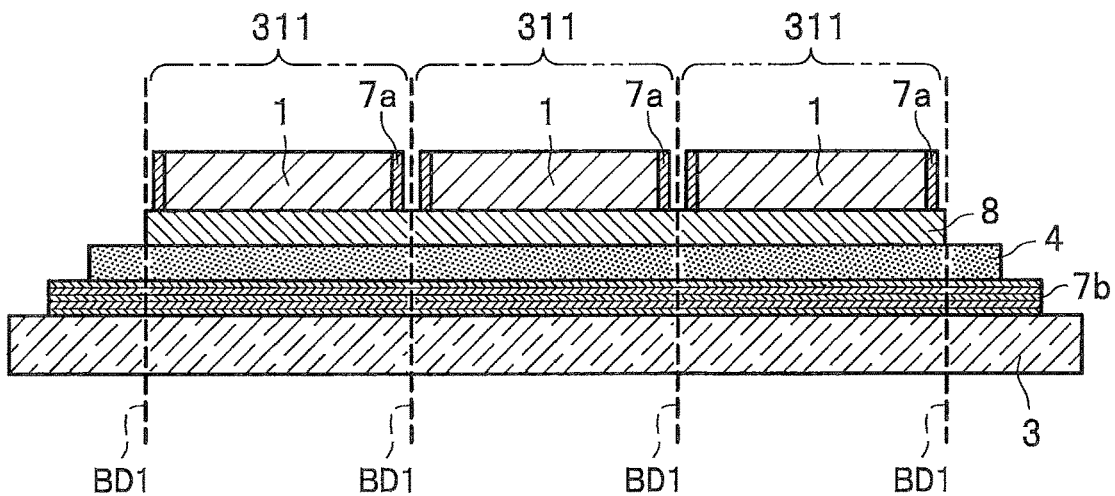
FIG. 7D is a cross-sectional view showing a light-transmissive member singulating step in the modification of the method of manufacturing the light-emitting device according to the first embodiment.

As illustrated in FIG. 7D, the light-transmissive member singulating step (S304) is a step of singulating the light-transmissive member 3 with the second dielectric multilayer film 7b and the phosphor layer 4 formed thereon. In the light-transmissive member singulating step (S304), the light-transmissive member 3 with the second dielectric multilayer film 7b and the phosphor layer 4 formed thereon is singulated along the dividing lines BD1 by cutting the light-transmissive member 3 while applying blade dicing, laser dicing or the like from between the first dielectric multilayer films 7a provided to each two neighboring light-emitting elements 1. Thereby, the second members 311 are formed. Incidentally, it is desirable that in the plan view, each dividing lines BD1 be set along the center of a portion of the bonding member 8 which is exposed between the corresponding first dielectric multilayer films 7a.

Figure 8A:
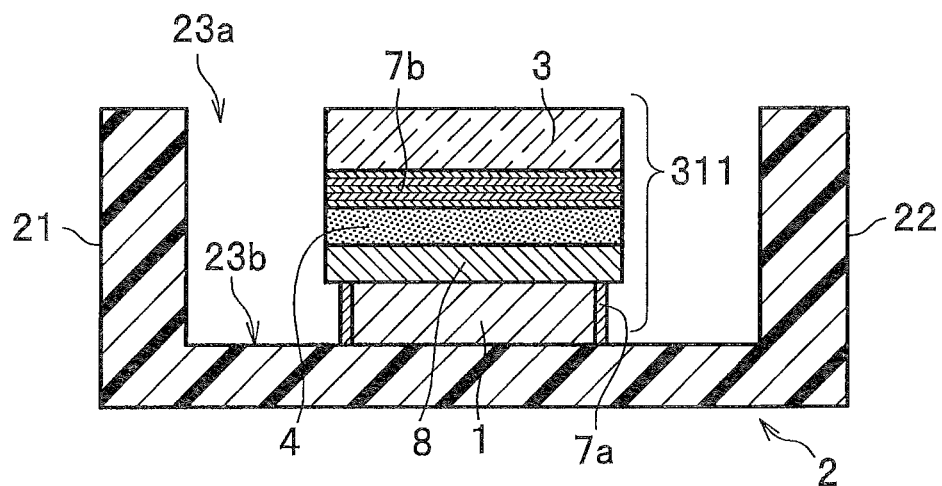
FIG. 8A is a cross-sectional view showing a light-emitting element mounting step in the modification of the method of manufacturing the light-emitting device according to the first embodiment.

As illustrated in FIG. 8A, the light-emitting element mounting step (S32) is a step of mounting the light-emitting element 1 of the second member 311 on the base 2 including the recess 23a. In the light-emitting element mounting step (S32), the second member 311 is directly mounted on the bottom surface 23b of the recess 23a of the base 2 with the light-emitting element 1 facing downward.

Figure 8B:
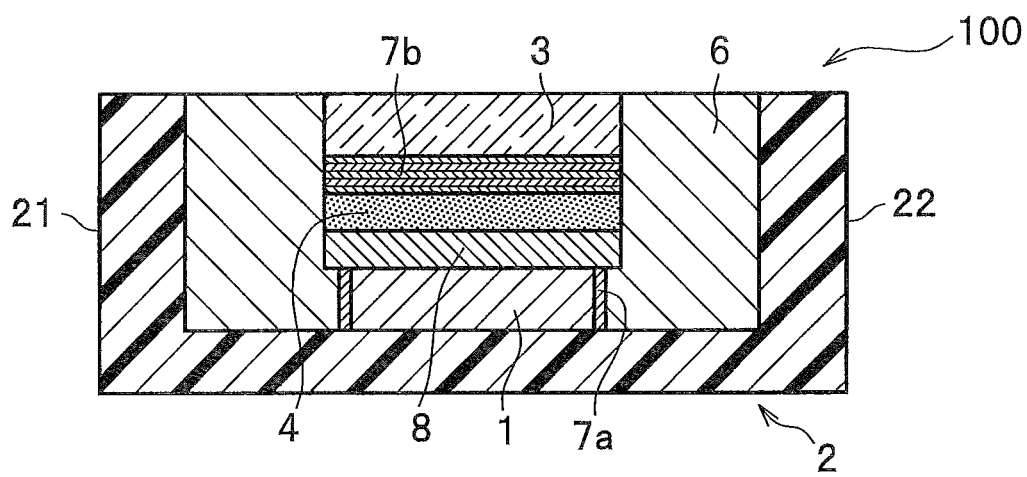
FIG. 8B is a cross-sectional view showing a reflective member arranging step in the modification of the method of manufacturing the light-emitting device according to the first embodiment.

As illustrated in FIG. 8B, the reflective member arranging step (S33) is a step of providing the reflective member 6 in the recess 23a of the base 2 until the reflective member 6 covers at least parts of the respective side surfaces of the phosphor layer 4, or in a way that makes the reflective member 6 cover at least parts of the respective third surfaces of the light-transmissive member 3. Incidentally, the reflective member arranging step (S33) is the same as the above-discussed reflective member arranging step (S24), and more descriptions will be omitted.

The light-emitting device 100 is manufactured by performing the steps as discussed above.

Second Embodiment

Configuration of Light-Emitting Device

Figure 9A:
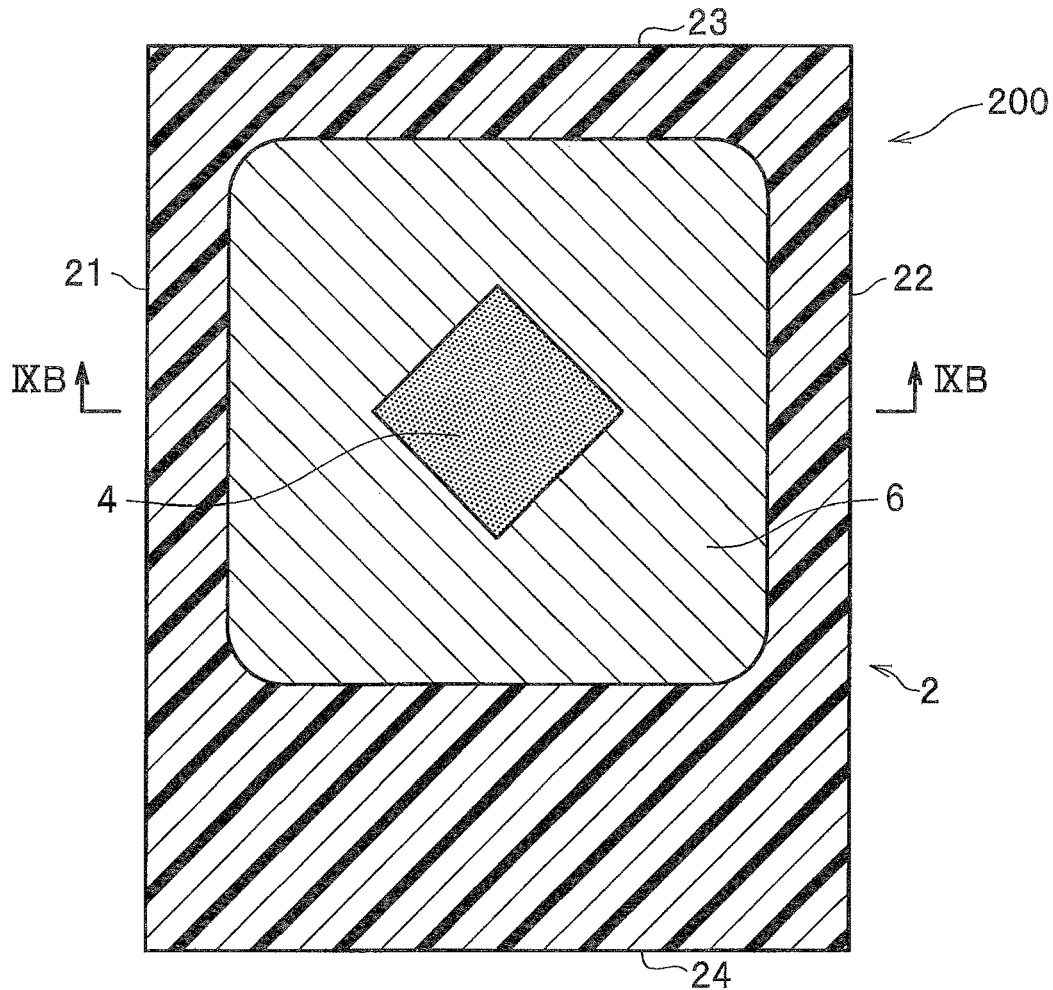
FIG. 9A is a plan view showing a configuration of a light-emitting device according to a second embodiment.
Figure 9B:
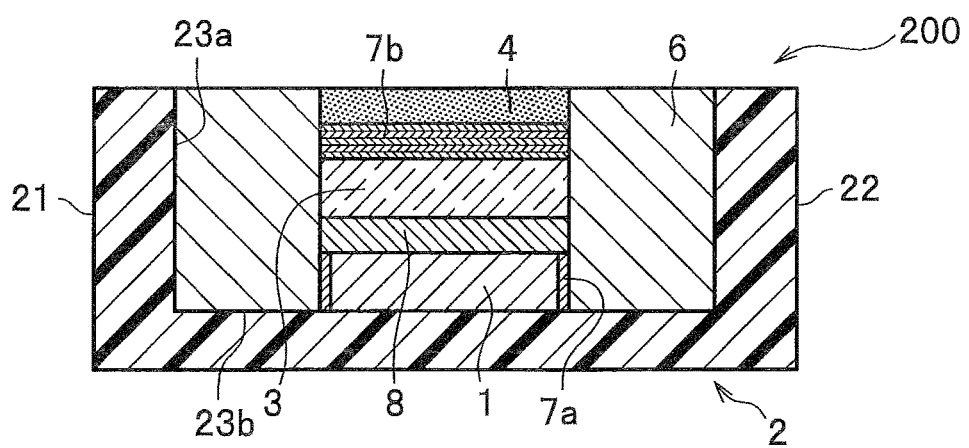
FIG. 9B is a cross-sectional view of the light-emitting device according to the second embodiment, taken along the IXB-IXB line of FIG. 9A.

Next, referring to FIGS. 9A and 9B, descriptions will be provided for a light-emitting device 200 according to a second embodiment. FIG. 9A is a plan view showing a configuration of the light-emitting device according to the second embodiment. FIG. 9B is a cross-sectional view showing the configuration of the light-emitting device according to the second embodiment, taken along the IXB-IXB line of FIG. 9A. Incidentally, descriptions for the same components as those in the first embodiment will be omitted.

The light-emitting device 200 includes: the light-transmissive member 3 including the first surface, the second surface opposite to the first surface, and the third surfaces connected to the first and second surfaces; the phosphor layer 4 facing the first surface of the light-transmissive member 3; the reflective member 6 facing the side surfaces of the phosphor layer 4 and the third surfaces of the light-transmissive member 3; the light-emitting element 1 facing the light-transmissive member 3; and the first dielectric multilayer film 7a arranged on at least one side surface of the light-emitting element 1. In the light-emitting device 200, no first dielectric multilayer film 7a is formed on the bonding surface of the phosphor layer 4 which faces the light-emitting element 1.

The light-emitting device 200 may include the second dielectric multilayer film 7b disposed between the light-transmissive member 3 and the phosphor layer 4.

In the light-emitting device 200 illustrated in FIG. 9B, the light-transmissive member 3, the second dielectric multilayer film 7b, and the phosphor layer 4 are arranged in this order from the light-emitting element 1. In contrast, in the light-emitting device 100 illustrated in FIG. 1B, the phosphor layer 4, the second dielectric multilayer film 7b, and the light-transmissive member 3 are arranged in this order from the light-emitting element 1. In other words, the light-emitting device 200 is different from the light-emitting device 100 in terms of where the light-transmissive member 3 and the phosphor layer 4 are arranged. The other configuration of the light-emitting device 200 is the same as that of the light-emitting device 100, and more descriptions will be omitted.

Like the light-emitting device 100 according to the first embodiment, the light-emitting device 200 according to the second embodiment is capable of reducing light which leaks from the side surfaces of the light-emitting element 1. Furthermore, unlike the light-emitting device 100, the light-emitting device 200 has the structure in which the phosphor layer 4 is located away from the light-emitting element 1, and heat from the light-emitting element 1 is hard to transmit to the phosphor layer 4. The light-emitting device is thus capable of inhibiting deterioration of the phosphor layer 4.

Moreover, the phosphor layer 4 constitutes the outermost surface of the light-emitting device, and this constitution makes it possible to facilitate dissipation of heat from the phosphor layer 4, and to thereby inhibit thermal deterioration of the phosphor layer 4.

Method of Manufacturing Light-Emitting Device

A method of manufacturing a light-emitting device according to the second embodiment is the same as the method of manufacturing the light-emitting device according to the first embodiment, except that in the first member bonding step (S23) illustrated in FIG. 5B, the first member 211 is bonded to the light-emitting element 1 with the light-transmissive member 3 of the first member 211 facing the first surface of the light-emitting element 1.

Moreover, a modification of the method of manufacturing the light-emitting device according to the second embodiment is the same as the modification of the method of manufacturing the light-emitting device according to the first embodiment, except that in the light-emitting element placing step (S303) illustrated in FIG. 7C, the second dielectric multilayer film 7b and the phosphor layer 4 are formed on one surface of the light-transmissive member 3, and thereafter the light-emitting element 1 is bonded to the opposite surface of the light-transmissive member 3.

The light-emitting device 200 is manufactured by performing the steps as discussed above.

Third Embodiment

Configuration of Light-Emitting Device

Figure 10A:
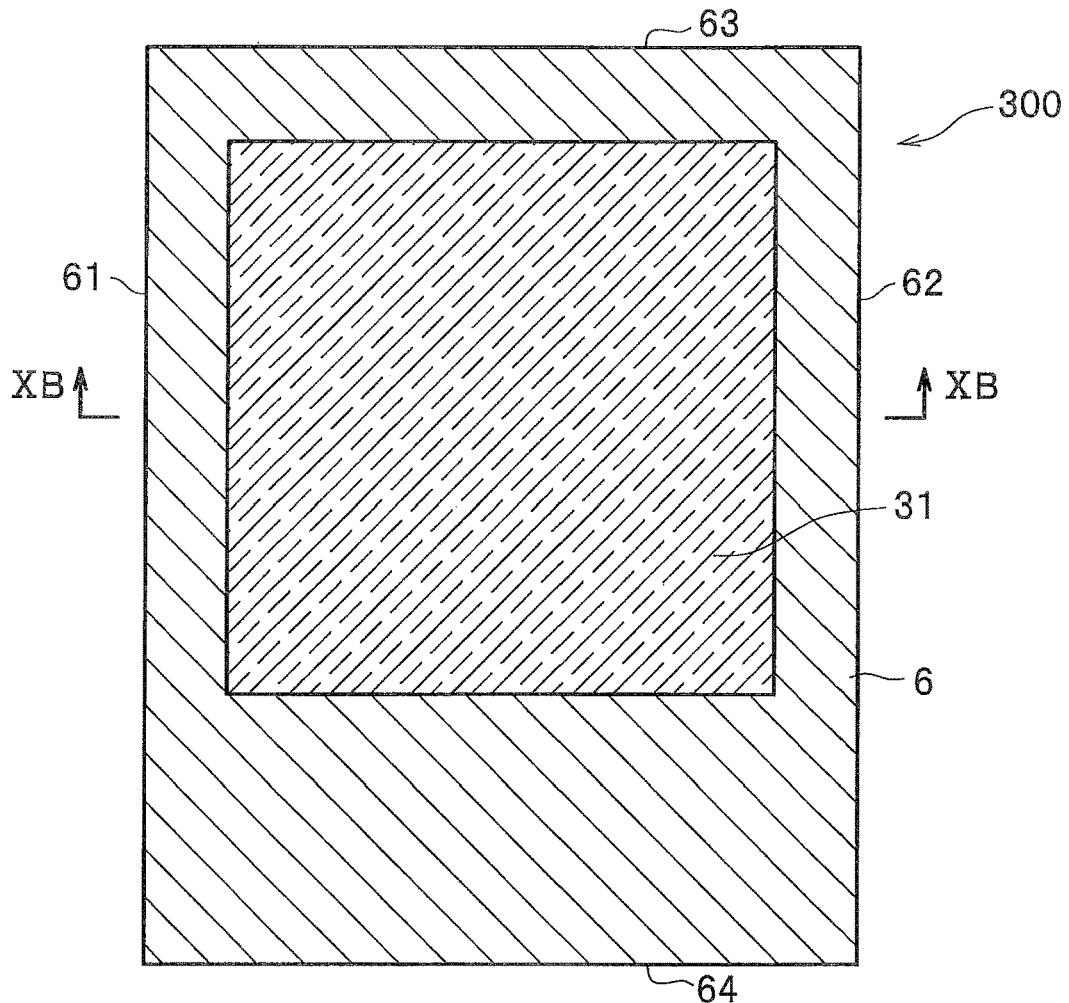
FIG. 10A is a plan view showing a configuration of a light-emitting device according to a third embodiment.
Figure 10B:
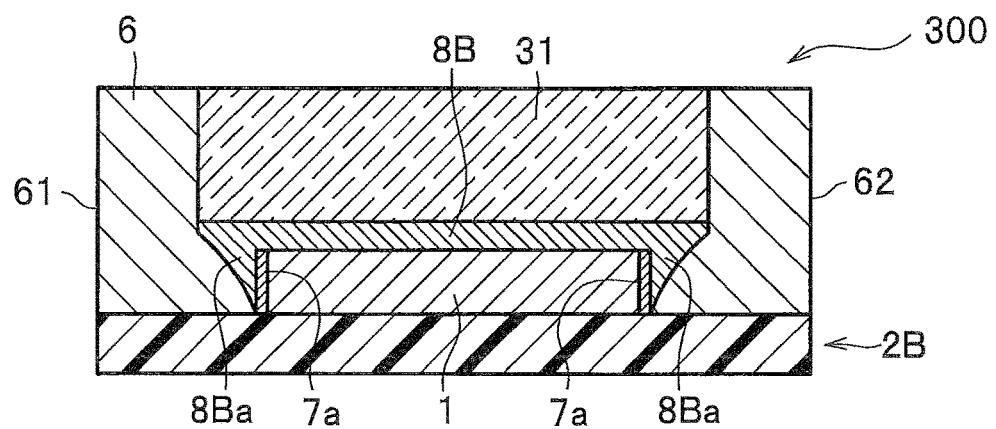
FIG. 10B is a cross-sectional view of the light-emitting device according to the third embodiment, taken along the XB-XB line of FIG. 10A.

Next, referring to FIGS. 10A and 10B, descriptions will be provided for a light-emitting device 300 according to a third embodiment. Incidentally, duplicate descriptions for the same components as those in the first embodiment will be omitted. FIG. 10A is a plan view showing a configuration of the light-emitting device according to the third embodiment. FIG. 10B is a cross-sectional view showing the configuration of the light-emitting device according to the third embodiment, taken along the XB-XB line of FIG. 10A.

The light-emitting device 300 includes: a phosphor block 31; the reflective member 6 arranged on the side surfaces of the phosphor block 31; the light-emitting element 1 arranged under the lower surface of the phosphor block 31; and the first dielectric multilayer film 7a arranged on at least one side surface of the light-emitting element 1.

The first surface of the light-emitting element 1 faces the phosphor block 31. The second surface of the light-emitting element 1 is arranged on a base 2B. The first dielectric multilayer film 7a is arranged on the third surfaces of the light-emitting element 1.

The base 2B is shaped like a flat plate. In the plan view, the external shape of the base is square.

The phosphor block 31 contains phosphor. The phosphor block 31 absorbs at least part of the near-ultraviolet to blue light emitted from the light-emitting element 1, and emits the blue-green to red light. Examples of the material of the phosphor include CASN phosphor, SCASN phosphor, KSF phosphor, YAG phosphor, LAG phosphor, silicate phosphor, and their combinations, as in the case of the phosphor contained in the phosphor layer 4.

The phosphor block 31 includes a first surface, a second surface opposite to the first surface, and third surfaces connected to the first and second surfaces. The first surface is an upper surface of the phosphor block 31, the second surface is a lower surface thereof, and the third surfaces are side surfaces thereof. The second surface of the phosphor block 31 is arranged facing the light-emitting element 1. The reflective member 6 is arranged on the third surfaces of the phosphor block 31.

For example, a sintered compact of phosphor, as well as resin, glass and other inorganic matters containing phosphor powder are used as the phosphor block 31. The sintered compact of phosphor may be formed by sintering only phosphor, or a mixture of phosphor and sintering additive. In the case where the mixture of phosphor and sintering additive is sintered, it is desirable that an inorganic matter such as silicon oxide, aluminum oxide or titanium oxide be used as the sintering additive. Thereby, discoloration and deformation of the sintering additive due to light and heat can be inhibited even if the output from the light-emitting element 1 is high. Incidentally, the phosphor block 31 has the same function as the phosphor layer 4 illustrated in FIG. 1B, but is different from the phosphor block 31 is not used together with the light-transmissive member 3.

The reflective member 6 is arranged on the side surfaces of the phosphor block 31. Furthermore, the reflective member 6 is arranged facing the first dielectric multilayer film 7a, and is capable of efficiently reflecting light which leaks from the first dielectric multilayer film 7a. Thus, the reflective member is capable of enhancing the light outputting efficiency of the light-emitting device 300.

In the plan view, the external shape of the reflective member 6 is square. A first wall portion 61, a second wall portion 62 and a third wall portion 63 of the reflective member 6 is thinner than a fourth wall portion 64 of the reflective member. Incidentally, in the plan view, the light-emitting element 1 is arranged with the side surfaces of the light-emitting element 1 respectively facing the wall portions of the reflective member 6.

The first dielectric multilayer film 7a is arranged on at least one side surface of the light-emitting element 1. It is desirable that the first dielectric multilayer film 7a be arranged on all the side surfaces of the light-emitting element 1. Since the fourth wall portion 64 is the thickest among the wall portions of the reflective member 6, the first dielectric multilayer film 7a does not have to be arranged on a side surface of the light-emitting element 1 which faces the fourth wall portion 64. The first dielectric multilayer film 7a makes the near-ultraviolet to blue light, emitted from the light-emitting element 1, be efficiently incident on the phosphor block 31. Specifically, the first dielectric multilayer film 7a has a high reflectance to the near-ultraviolet to blue light emitted from the light-emitting element 1, and has a high transmittance to the blue-green to red light emitted from the phosphor block 31.

The bonding member 8B bonds the light-emitting element 1 and the phosphor block 31 together. The bonding member 8B is arranged on the first surface of the light-emitting element 1 and the first dielectric multilayer film 7a. A part of the bonding member 8B provided to the first dielectric multilayer film 7a forms the fillet 8Ba, and thereby enables the light emitted from the light-emitting element 1 to be easily incident on the phosphor block 31.

In the light-emitting device 300 according to the third embodiment, the first dielectric multilayer film 7a is arranged on at least one side surface of the light-emitting element 1. Thereby, the light-emitting device 300 is capable of reducing light which leaks from the side surfaces of the light-emitting element 1.

Method of Manufacturing Light-Emitting Device

Figure 11:
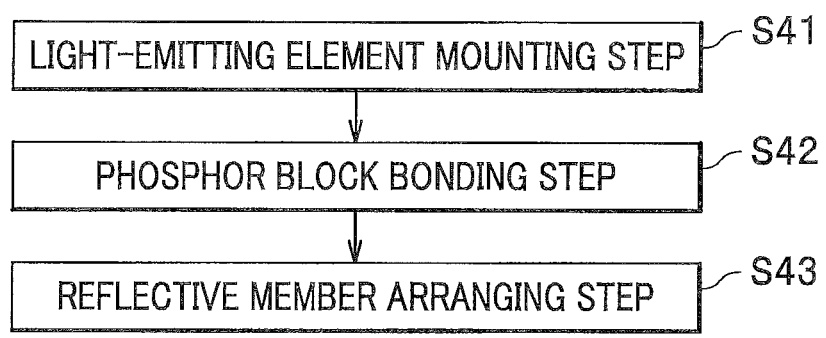
FIG. 11 is a flowchart showing a procedure for a method of manufacturing a light-emitting device according to the third embodiment.

Next, referring to FIG. 11, descriptions will be provided for a method of manufacturing a light-emitting device according to the third embodiment.

The method of manufacturing the light-emitting device according to the third embodiment includes a light-emitting element mounting step (S41), a phosphor block bonding step (S42), and a reflective member arranging step (S43).

The light-emitting element mounting step (S41) is a step of mounting the light-emitting element 1 with the first dielectric multilayer film 7a arranged on at least one side surface thereof onto the base 2B.

The phosphor block bonding step (S42) is a step of bonding the light-emitting element 1 and the phosphor block 31 together. In the phosphor block bonding step (S42), the bonding member 8B is formed on the bonding surface of the light-emitting element 1 and/or the bonding surface of the phosphor block 31 by coating or the like, and the bonding surfaces are bonded together using the bonding member 8B.

The reflective member arranging step (S43) is a step of providing the reflective member 6 in a way that makes the reflective member cover at least parts of the respective side surfaces of the phosphor block 31. In this step, first of all, the inside of the frame arranged surrounding the light-emitting element 1 is filled with uncured resin, containing dispersed light reflective substance, by potting using a dispenser, or the like. After that, the filled resin is formed into the reflective member 6 by: heating the resin at the predetermined temperature for the predetermined time length using a heating apparatus such as a heater or a reflow furnace; and thereafter removing the frame.

The light-emitting device 300 is manufacture by performing the above steps as discussed above.

Fourth Embodiment

Figure 12A:
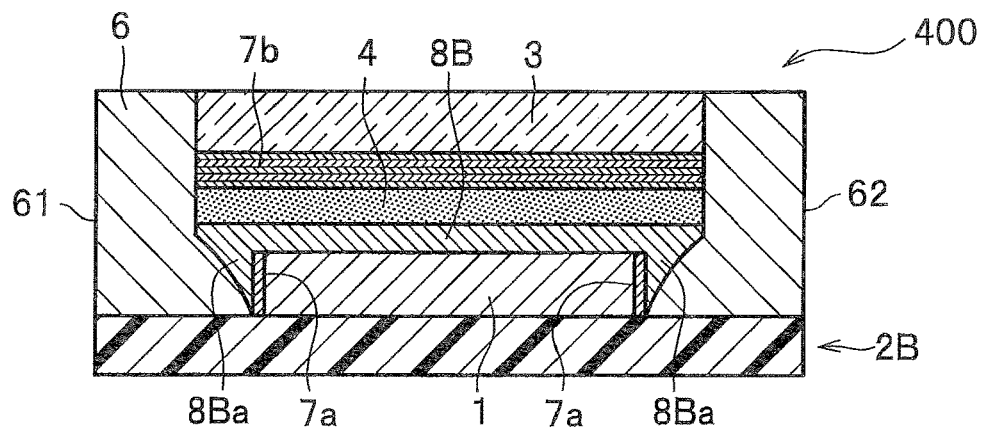
FIG. 12A is a cross-sectional view showing a configuration of a light-emitting device according to a fourth embodiment.

Next, referring to FIG. 12A, descriptions will be provided for a configuration of a light-emitting device 400 according to a fourth embodiment. Incidentally, duplicated descriptions for the same components as those in the first embodiment will be omitted. FIG. 12A is a cross-sectional view showing a configuration of the light-emitting device according to the fourth embodiment.

The light-emitting device 400 is the light-emitting device 100 illustrated in FIGS. 1A and 1B which employs the base 2B including no recess 23a and thus shaped like a flat plate. Like in the light-emitting device 300 illustrated in FIG. 10A, the external shape of the base 2B is square in the plan view. Thus, like in the light-emitting device 300 illustrated in FIG. 10A, in the light-emitting device 400, the first wall portion 61 and the second wall portion 62 of the reflective member 6 are thinner than the other wall portions thereof. Furthermore, the light-emitting device 400 employs the bonding member 8B whose portion corresponding to the fillet 8Ba is shaped substantially like a triangle in the cross-sectional view. Since the first dielectric multilayer film 7a is arranged on at least one side surface of the light-emitting element 1, the light-emitting device 400 is capable of reducing light which leaks from the side surfaces of the light-emitting element 1.

The method of manufacturing the light-emitting device according to the fourth embodiment is the same as the method of manufacturing the light-emitting device according to the first embodiment.

Modifications

Figure 12B:
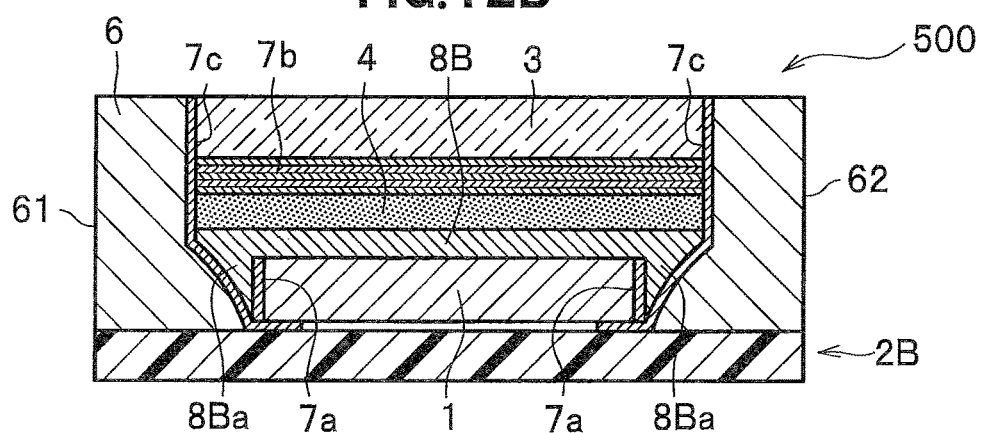
FIG. 12B is a cross-sectional view showing a configuration of a modification of the light-emitting device according to the fourth embodiment.

Next, referring to FIG. 12B, descriptions will be provided for a first modification of the light-emitting device 400 according to the fourth embodiment. A light-emitting device 500 is the light-emitting device 400 illustrated in FIG. 12A which further includes a third dielectric multilayer film 7c.

The third dielectric multilayer film 7c is arranged on the side surfaces of the light-transmissive member 3, the side surfaces of the second dielectric multilayer film 7b, the side surfaces of the phosphor layer 4, and the side surfaces of the parts of the bonding member 8B which correspond to the fillet 8B*a*. Like the first dielectric multilayer film 7a, the third dielectric multilayer film 7c has a high reflectance to the near-ultraviolet to blue light emitted from the light-emitting element 1, and has a high transmittance to the blue-green to red light emitted from the phosphor layer 4. The third dielectric multilayer film 7c makes the near-ultraviolet to blue light, emitted from the light-emitting element 1, be efficiently incident on the phosphor layer 4.

Since the light-emitting device 500 includes the third dielectric multilayer film 7c, the light-emitting device 500 is capable of further reducing sideward leakage of the near-ultraviolet to blue light.

The third dielectric multilayer film 7c may be formed by atomic layer deposition, for example, after the first member bonding step (S23) in FIG. 3, but before the reflective member arranging step (S24) in FIG. 3.

Furthermore, it is desirable that the third dielectric multilayer film 7c be arranged on the second surface of the light-emitting element 1 as well, except for its element electrode. This configuration makes it possible to prevent light from leaking from the light-emitting element 1 to the element electrode. In this case, the third dielectric multilayer film 7c may be formed by atomic layer deposition, for example, after the second member providing step (S31) in FIG. 6, but before the light-emitting element mounting step (S32) in FIG. 6.

Figure 12C:
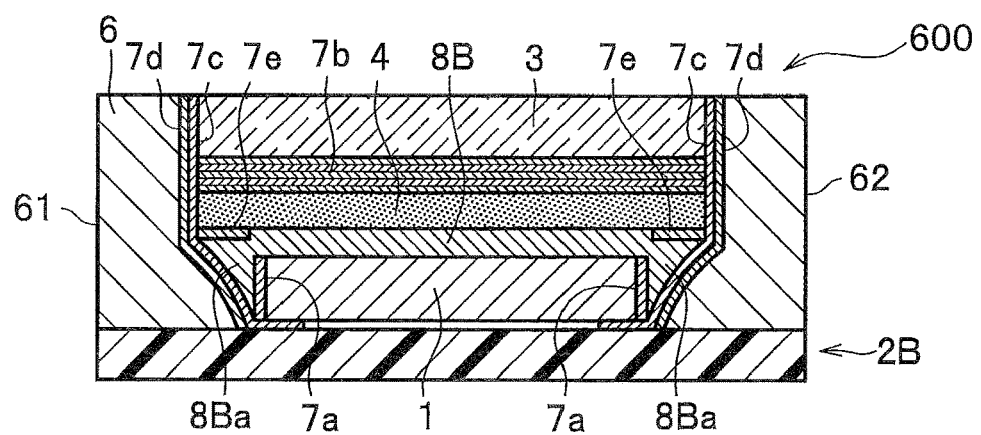
FIG. 12C is a cross-sectional view showing a configuration of another modification of the light-emitting device according to the fourth embodiment.

Next, referring to FIG. 12C, descriptions will be provided for a second modification of the light-emitting device 400 according to the fourth embodiment. A light-emitting device 600 is the light-emitting device 500 illustrated in FIG. 12B which further includes a fourth dielectric multilayer film 7d.

The fourth dielectric multilayer film 7d is formed by alternately depositing at least two types of dielectric layers. The fourth dielectric multilayer film 7d is arranged beside the side surfaces of the light-transmissive member 3, the side surfaces of the second dielectric multilayer film 7b, the side surfaces of the phosphor layer 4, and the side surfaces of the parts of the bonding member 8B which correspond to the fillet 8B*a*. The fourth dielectric multilayer film 7d has a high transmittance to the near-ultraviolet to blue light emitted from the light-emitting element 1, and has a high reflectance to the blue-green to red light emitted from the phosphor layer 4. The reflectance of the fourth dielectric multilayer film 7d to the phosphor light is preferably 90% or greater when the angle of incidence of the phosphor light is in a range of 0° to 30°, and more preferably 95% or greater when the angle of incidence of the phosphor light is in a range of 0° to 30°.

Since the light-emitting device 600 includes the fourth dielectric multilayer film 7d, the light-emitting device 600 is capable of reducing sideward leakage of the blue-green to red light. Incidentally, the fourth dielectric multilayer film 7d may be formed by atomic layer deposition, for example, before the reflective member arranging step (S24, S33).

Furthermore, it is desirable that in the light-emitting device 600, a fifth dielectric multilayer film 7e be arranged on a surface portion of the phosphor layer 4 which is not hidden behind the light-emitting element 1 in a view of the phosphor layer 4 from the second surface of the light-emitting element 1. In other words, it is desirable that the fifth dielectric multilayer film 7e be arranged on the surface portion of the phosphor layer 4 which is out of the light-emitting element 1 in the view of the phosphor layer 4 from the second surface of the light-emitting element 1. The fifth dielectric multilayer film 7e can be formed in the following sequence. For example, after the phosphor layer forming step (S202) in FIG. 3, first of all, a bonding area on the surface of the phosphor layer 4 which is going to be bonded to the first surface of the light-emitting element 1 is masked. Thereafter, dielectric is deposited on the unmasked area on the surface of the phosphor layer 4, for example, by atomic layer deposition or the like.

The fifth dielectric multilayer film 7e is formed by alternately depositing at least two types of dielectric layers. Like the fourth dielectric multilayer film 7d, the fifth dielectric multilayer film 7e has a high transmittance to the near-ultraviolet to blue light emitted from the light-emitting element 1, and has a high reflectance to the blue-green to red light emitted from the phosphor layer 4. Due to this, configuration, the light-emitting device 600 causes near-ultraviolet to blue light going out from the side surfaces of the light-emitting element 1 to be reflected by the fillet 8B*a* of the bonding member 8B or the reflective member 6 even if the near-ultraviolet to blue light leaks from the first dielectric multilayer film 7a. In a case where this reflected light (near-ultraviolet to blue light) is emitted upward to reach the fifth dielectric multilayer film 7e, the fifth dielectric multilayer film 7e transmits the near-ultraviolet to blue light. The fifth dielectric multilayer film 7e, therefore, substantially does not hinder the near-ultraviolet to blue light from being incident on the phosphor layer 4. Meanwhile, in a case where the blue-green to red light leaking downward from the phosphor layer 4 reaches the fifth dielectric multilayer film 7e, the fifth dielectric multilayer film 7e reflects the blue-green to red light. The upward output of the blue-green to red light, therefore, can be enhanced.

EXAMPLE

The following experiment was carried out in order to check the performance of the light-emitting devices disclosed herein.

To begin with, a light-emitting device (hereinafter referred to as "Example 1") similar to the light-emitting device 400 according to the fourth embodiment was produced under the following conditions.

Light-Emitting Element 1

Number: 1
Type: Blue LED (GaN-based semiconductor light-emitting element) with an emission peak wavelength of approximately 450 nm
External dimensions in the plan view: square in which each side was 1.00 mm long

Base 2B

Material: lead frame
Shape: flat plate

Light-Transmissive Member 3

Material: glass
External dimensions in the plan view: square in which each side was 1.15 mm long Shape: flat plate
Thickness: 148 μm Phosphor Layer 4

Base material: silicone resin
Phosphor: CASN (with a content of 65% by mass)
External dimensions in the plan view: square in which each side was 1.15 mm long
Thickness: 68 μm Reflective Member 6

Base material: silicone resin
Light reflective substance: $TiO_2$ (with a content of 45% by mass)

First Dielectric Multilayer Film 7a

Number of layers: 7
Material: $SiO_2/TiO_2/SiO_2/TiO_2/SiO_2/TiO_2/SiO_2$
Arrangement: all the side surfaces of the light-emitting element, and the electrode surface of the light-emitting element except for the element electrode Bonding Member 8B

Base material: silicone resin
External dimensions in the plan view: square in which each side was 1.15 mm long Second Dielectric Multilayer Film 7b

Number of layers: 31
Material: $SiO_2/TiO_2/SiO_2/TiO_2/\ldots/SiO_2$
Arrangement: between the light-transmissive member 3 and the phosphor layer 4

Comparative Example

A light-emitting device according to a comparative example was produced in order to compare the light-emitting device according to the comparative example with the light-emitting device according to the example. The light-emitting device according to the comparative example included no first dielectric multilayer film 7a, and was used as Comparative Example 1. The other components (the light-emitting element 1, the base 2B, the light-transmissive member 3, the phosphor layer 4, the reflective member 6, the second dielectric multilayer film 7b and the bonding member 8B) in Comparative Example 1 were the same as those in Example 1.

In the experiment, 8 samples of Comparative Example 1 were produced. The values representing the chromaticity coordinates x of the samples were roughly distributed in a range of 0.683 to 0.687. The luminous flux of each example was measured.

Meanwhile, 10 samples of Example 1 were produced. The values representing the chromaticity coordinates x of the samples were roughly distributed in a range of 0.687 to 0.688. The luminous flux of each sample was measured.

Since the values representing the chromaticity coordinates x of the samples of Example 1 were different from the values representing the chromaticity coordinates x of the samples of Comparative Example 1, the measured values representing the luminous fluxes of the samples of Example 1 were unable to be compared with the measured values representing the luminous fluxes of the samples of Comparative Example 1. With this taken in consideration, from the samples of Example 1, a regression line of the luminous fluxes relative to the chromaticity coordinates x was obtained, and the luminous flux on this regression line when x=0.688 was used as the luminous flux of Example 1. Similarly, from the samples of Comparative Example 1, a regression line of the luminous fluxes relative to the chromaticity coordinates x was obtained, and the luminous flux on this regression line when x=0.688 was used as the luminous flux of Comparative Example 1. The thus-obtained luminous flux of Comparative Example 1 was 17.87 [lm], while the thus-obtained luminous flux of Example 1 was 17.80 [lm]. In other words, when the luminous flux of Comparative Example 1 was converted into 100 [%], the relative luminous flux of Example 1 was 99.6 [%]. From this result, it was learned that the luminous flux of Example 1, although slightly decreased, was able to be held at a relatively high value.

An xy chromaticity graph was obtained by plotting the chromaticity coordinates (x, y) of each sample of Example 1 and Comparative Example 1 thereon. On the graph, the chromaticity of Example 1 shifted from the chromaticity of Comparative Example 1 toward the longer wavelength. This made the color purity (96.6%) of Example 1 greater than the color purity (95.5%) of Comparative Example 1. From this, it was learned that the color purity of the red light in the light-emitting device was able to be enhanced by arranging the first dielectric multilayer film 7a on the side surfaces of the light-emitting element 1.

Figure 13:
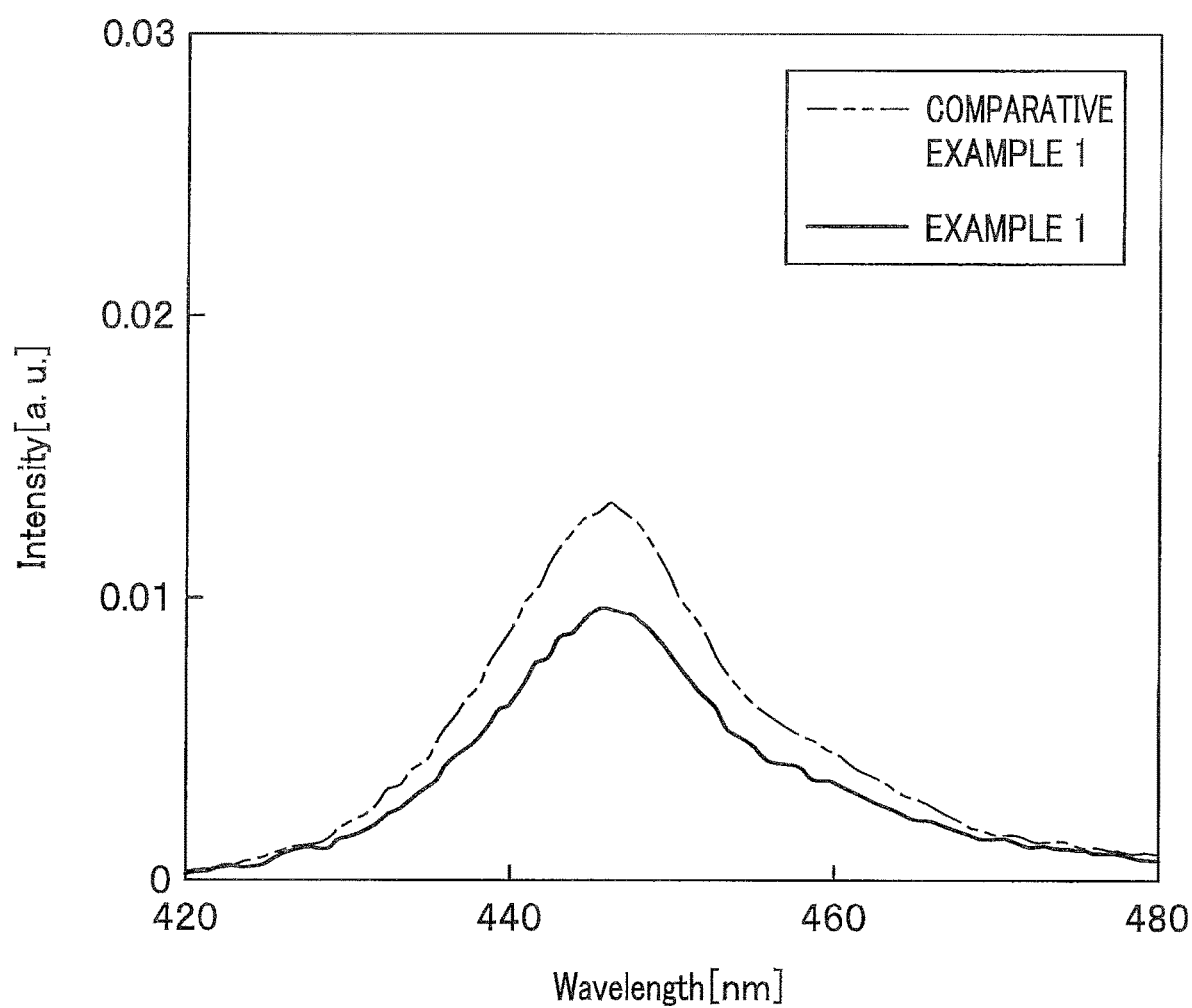
FIG. 13 is a graph showing relationships between emission wavelength and light intensity.

FIG. 13 is a graph showing a relationship between emission wavelength and light intensity for each of Example 1 and Comparative Example 1. The vertical axis represents the light intensity [arbitrary unit (a.u.)], while the horizontal axis represents the wavelength [nm]. In FIG. 13, the solid line represents Example 1, while the chain double-dashed line represents Comparative Example 1. Although the light intensities were measured in a wavelength range of 400 to 800 nm, FIG. 13 shows measurement results in a wavelength range of 420 to 480 nm. As shown in FIG. 13, the spectrum of Example 1 was lower around 450 nm than that of Comparative Example 1. The spectrum around 450 nm corresponded to the spectrum of blue light. In other words, the intensity of the blue light of Comparative Example 1 was greater than the intensity of the blue light of Example 1. From this, it was learned that the leakage of the blue light in the light-emitting device was able to be reduced by arranging the first dielectric multilayer film 7a on the side surfaces of the light-emitting element 1.

Figure 14A:
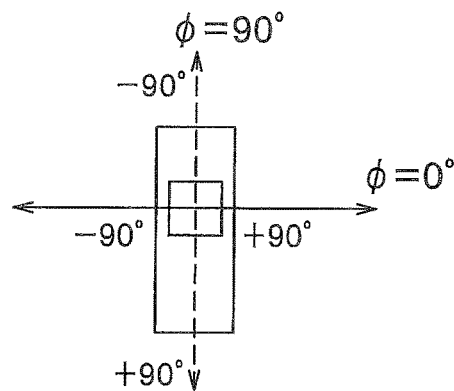
FIG. 14A is a top view of Example 1.
Figure 14B:
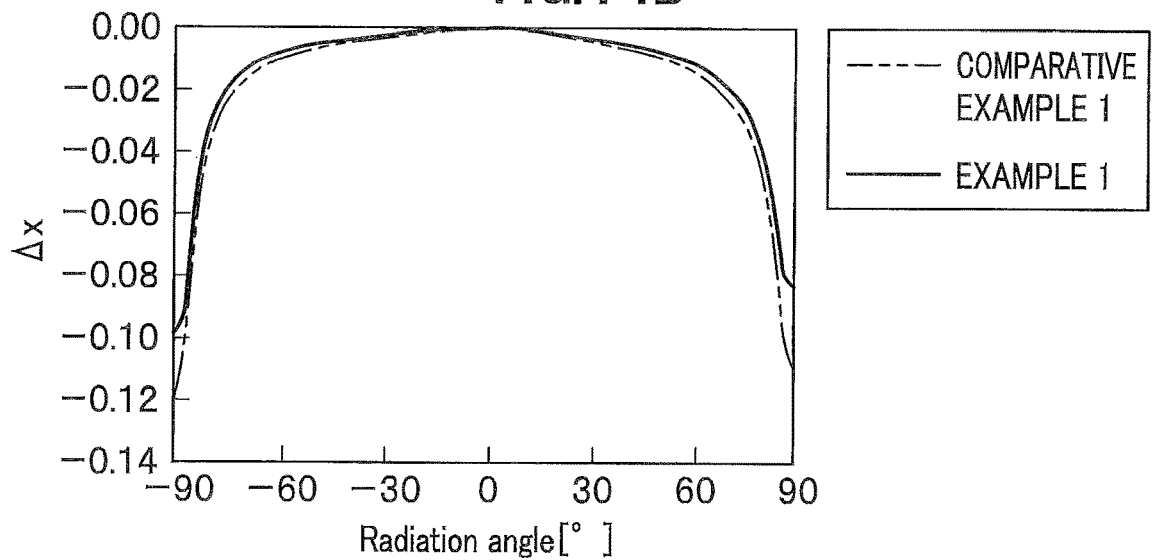
FIG. 14B is a diagram showing a relationship between a radiation angle and displacement of the x coordinate.
Figure 14C:
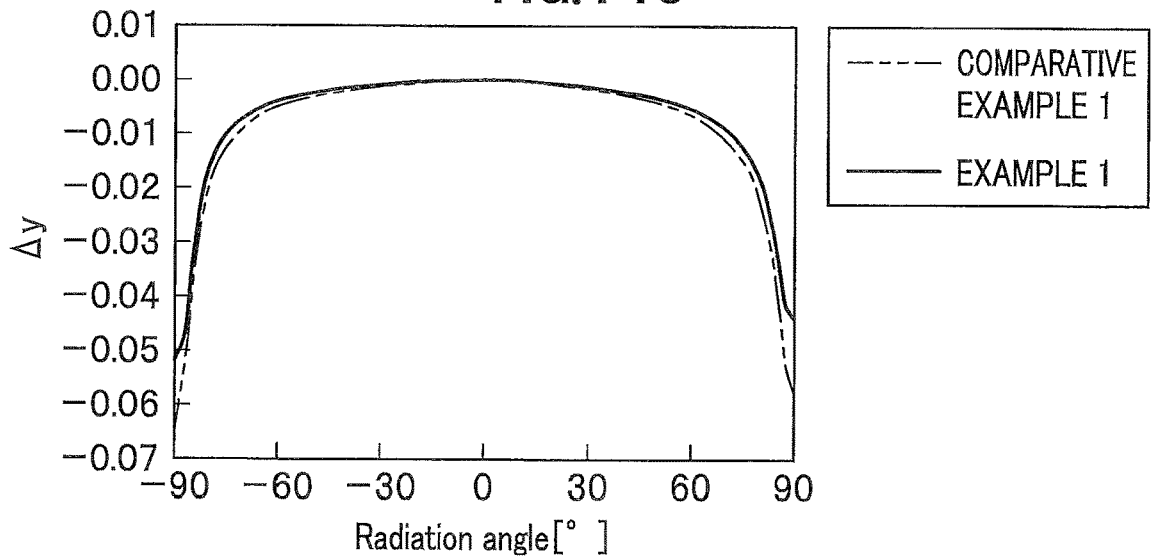
FIG. 14C is a diagram showing a relationship between a radiation angle and displacement of the y coordinate.

Referring to FIGS. 14A to 14C, descriptions will be provided for results of measuring a luminous intensity distribution property of Example 1. FIG. 14A is a top view of Example 1. FIG. 14B is a diagram showing a relationship between a radiation angle and displacement of the x coordinate. FIG. 14C is a diagram showing a relationship between a radiation angle and displacement of the y coordinate.

In the light-emitting device illustrated in FIG. 14A, the walls of the reflective member 6 which extended in the short direction (φ=0°) were thinner than the walls thereof which extended in the longitudinal direction (φ=90°). In this respect, FIG. 14B shows the displacement of the x coordinate measured in a radiation angle range of −90° to +90° with respect to the short direction (φ=0°) of the light-emitting device illustrated in FIG. 14A. The vertical axis represents the displacement (Δx) of the x coordinate on the xy chromaticity graph, while the horizontal axis represents the radiation angle [°]. Similarly, FIG. 14C shows the displacement (Δy) of the y coordinate measured in a radiation angle range of −90° to +90° with respect to the short direction (φ=0°) of the light-emitting device illustrated in FIG. 14A. The vertical axis represents the displacement (Δy) of the y coordinate on the xy chromaticity graph, while the horizontal axis represents the radiation angle [°]. In FIGS. 14B and 14C, the solid line represents Example 1, while the chain double-dashed line represents Comparative Example 1.

As shown in FIGS. 14B and 14C, in Example 1 and Comparative Example 1, as the absolute value of the radiation angle became larger, the absolute values of Δx and Δy became larger. In this respect, in the case where the signs of Δx and Δy were − (minus), the absolute values of Δx and Δy became larger, the color purity became lower. In other words, as the absolute value of the radiation angle became larger, the color purity tended to become lower.

Furthermore, almost no difference existed between Example 1 and Comparative Example 1 when the absolute value of the radiation angle was in a range of 0° to around 30°. In contrast, the absolute values of Δx and Δy in Comparative Example 1 were larger than the absolute values of Δx and Δy in Example 1 when the absolute value of the radiation angle was in a range of around 30° to around 90°. The difference between Comparative Example 1 and Example 1 was very large particularly when the absolute value of the radiation angle was 85° or greater. From this, it was learned that the arrangement of the first dielectric multilayer film 7a on the side surfaces of the light-emitting element 1 made it possible to reduce the leakage of the blue light from the side surface of the light-emitting device, and to enhance the color purity of the red light in the light-emitting device.

While the light-emitting device and the method of manufacturing the light-emitting device according to this disclosure have been specifically described above with reference to certain embodiments, it is to be understood that the scope of the present invention is not limited to the above descriptions but should be interpreted in a broad sense based on the definition of the appended claims. Moreover, it is needless to say that various modifications, alterations and the like based on these descriptions are also encompassed by the scope of the present invention.

The light-emitting devices according to certain embodiments of the present disclosure can be used for light-emitting devices for vehicles.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:
a light-emitting element having a top surface, a bottom surface opposite to the top surface, and side surfaces connecting the top surface and the bottom surface, an element electrode of the light-emitting element being located on the bottom surface;
a phosphor layer disposed above the top surface of the light-emitting element and having side surfaces;
a reflective member covering side surfaces of the light-emitting element and side surfaces of the phosphor layer; and
a dielectric multilayer film disposed on at least one of the side surfaces of the light-emitting element and disposed on at least one of the side surfaces of the phosphor layer and not located between the light emitting element and the phosphor layer,
wherein the dielectric multilayer film is not provided on an upper surface of the phosphor layer.

2. The light-emitting device according to claim 1, wherein the phosphor layer and the light-emitting element are directly bonded to each other.

3. The light-emitting device according to claim 1, wherein the phosphor layer is bonded to the light-emitting element via a bonding member.

4. The light-emitting device according to claim 3, wherein the dielectric multilayer film is arranged on the side surfaces of the light-emitting element, and
wherein the bonding member is arranged on the top surface of the light-emitting element and on the dielectric multilayer film.

5. The light-emitting device according to claim 4, wherein a shape of the bonding member which is arranged on the side surfaces of the light-emitting element is a substantially triangle in a vertical sectional view.

6. The light-emitting device according to claim 1, further comprising a base having a recess, the light-emitting element being arranged on a bottom surface of the recess of the base, the reflective member being filled into the recess.

7. The light-emitting device according to claim 1, wherein the light-emitting element is configured to emit a light having a wavelength in a range of near-ultraviolet light to blue light, and
wherein the phosphor layer is configured to convert at least part of the light emitted from the light-emitting element to a light having a wavelength in a range of blue-green to red light.

8. The light-emitting device according to claim 1, wherein an area of the light-emitting element is smaller than an area of the phosphor layer in plan view.

9. The light-emitting device according to claim 1, wherein the dielectric multilayer film is arranged on all of the side surfaces of the light-emitting element.

10. The light-emitting device according to claim 1, wherein the light-emitting element is arranged on a base, and
wherein the base is in contact with the reflective member.

11. The light-emitting device according to claim 1, wherein the dielectric multilayer film is disposed directly on the at least one of the side surfaces of the phosphor layer.

12. The light-emitting device according to claim 1, further comprising an additional dielectric multilayer film disposed directly on the at least one of the side surfaces of the light-emitting element,
wherein the dielectric multilayer film is disposed on the additional dielectric film.

13. The light-emitting device according to claim 12, further comprising a further dielectric multilayer film disposed directly on the additional dielectric multilayer film,
wherein the further dielectric multilayer film is disposed on the at least one of the side surfaces of the light-emitting element and is disposed on the at least one of the side surfaces of the phosphor layer.

14. The light-emitting device according to claim 1, wherein the dielectric multilayer film is disposed on the bottom surface of the light-emitting element except for at least a part of the element electrode.

15. The light-emitting device according to claim 1, wherein the upper surface of the phosphor layer and a top surface of the reflective member are in a same plane.

16. The light-emitting device according to claim 1, wherein the reflective member has a wall portion, and wherein a thickness of the wall portion that covers the side surface of the phosphor layer is equal to a thickness of an upper surface of the wall portion.

* * * * *